(12) United States Patent
Gao et al.

(10) Patent No.: US 7,378,848 B2
(45) Date of Patent: May 27, 2008

(54) MAGNETIC RESONANCE COIL SYSTEM

(75) Inventors: Erzhen Gao, Millburn, NJ (US); Jon T. DeVries, Jersey City, NJ (US); C. Richard Hullihen, III, Cleveland, OH (US); Wallace Y. Kunimoto, Goleta, CA (US); Timothy W. James, Santa Barbara, CA (US)

(73) Assignee: M2M Imaging Corp., Highland Heights, OH (US)

( * ) Notice: Subject to any disclaimer, the term of this patent is extended or adjusted under 35 U.S.C. 154(b) by 0 days.

(21) Appl. No.: 11/418,867

(22) Filed: May 5, 2006

(65) Prior Publication Data

US 2007/0257674 A1 Nov. 8, 2007

(51) Int. Cl.
*G01V 3/00* (2006.01)
(52) U.S. Cl. .................................... 324/318
(58) Field of Classification Search ....... 324/300–322; 600/410–435
See application file for complete search history.

(56) References Cited

U.S. PATENT DOCUMENTS

| | | | |
|---|---|---|---|
| 4,924,185 A * | 5/1990 | Matsutani | 324/319 |
| 5,175,030 A | 12/1992 | Lu et al. | |
| 5,183,597 A | 2/1993 | Lu | |
| 5,882,774 A | 3/1999 | Lonza et al. | |
| 6,100,693 A * | 8/2000 | Eberler et al. | 324/318 |
| 6,275,723 B1 | 8/2001 | Ferris et al. | |
| 6,310,480 B1 * | 10/2001 | Cohen et al. | 324/321 |
| 6,323,647 B1 * | 11/2001 | Anderson et al. | 324/313 |
| 6,411,092 B1 * | 6/2002 | Anderson | 324/319 |
| 6,538,440 B2 * | 3/2003 | Dean et al. | 324/318 |
| 6,591,128 B1 * | 7/2003 | Wu et al. | 600/422 |
| 6,812,705 B1 * | 11/2004 | Sellers | 324/318 |
| 6,825,664 B2 * | 11/2004 | Kwok et al. | 324/318 |
| 6,838,880 B2 * | 1/2005 | Hofmann et al. | 324/318 |
| 6,879,852 B1 * | 4/2005 | Mueller | 600/410 |
| 6,943,550 B2 * | 9/2005 | Cheng et al. | 324/318 |

(Continued)

OTHER PUBLICATIONS

Vikuiti Display Enhancement, Vikuiti Enhanced Specular Reflector (ESR), Product information sheet, 2002, 2 pages, 3M Electrical Display Lighting Optical systems Division, www.3M.com/Vikuiti.

(Continued)

*Primary Examiner*—Brij Shrivastav
*Assistant Examiner*—Dixomara Vargas
(74) *Attorney, Agent, or Firm*—Anthony M. Del Zoppo, III; Driggs, Hogg, Daugherty & Del Zoppo, Co. L.P.A.

(57) ABSTRACT

A magnetic resonance coil system 18 allows for the use of modular components and which in one embodiment is particularly well-suited for use with small animals and includes an animal receiving apparatus 202, a transmit coil module 204, and a receive coil module 206. The receive coil module 206 includes a cryogenic receive coil. The coil system 18 is selectively insertable in the bore of the gradient coil of a magnetic resonance examination system.

73 Claims, 13 Drawing Sheets

U.S. PATENT DOCUMENTS

| | | |
|---|---|---|
| 6,946,841 B2 | 9/2005 | Rubahov |
| 6,953,623 B2 | 10/2005 | Olson et al. |
| 7,002,348 B2 * | 2/2006 | Kwok et al. ................ 324/322 |
| 7,015,692 B2 * | 3/2006 | Clarke et al. ............... 324/300 |
| 7,146,936 B2 * | 12/2006 | Dazai et al. ................ 119/756 |
| 7,167,000 B2 * | 1/2007 | Amm et al. ................. 324/318 |
| 2004/0204642 A1 | 10/2004 | Ferris et al. |
| 2005/0113667 A1 | 5/2005 | Schlyer et al. |

OTHER PUBLICATIONS

West et al., LED backlight for large area LCD TV's, 2003, 4 pages, http://www.me.ncu.edu.tw/teacher/Teacher-28/public_html/course/mea003/1023%E7%8E%8B%E7%8E%89%E4%BB%99.pdf.

Mann et al., A Small Superconductive Surface Coil with Enhanced Bandwidth and Active Decoupling, downloaded on May 2, 2006, 1 sheet.

* cited by examiner

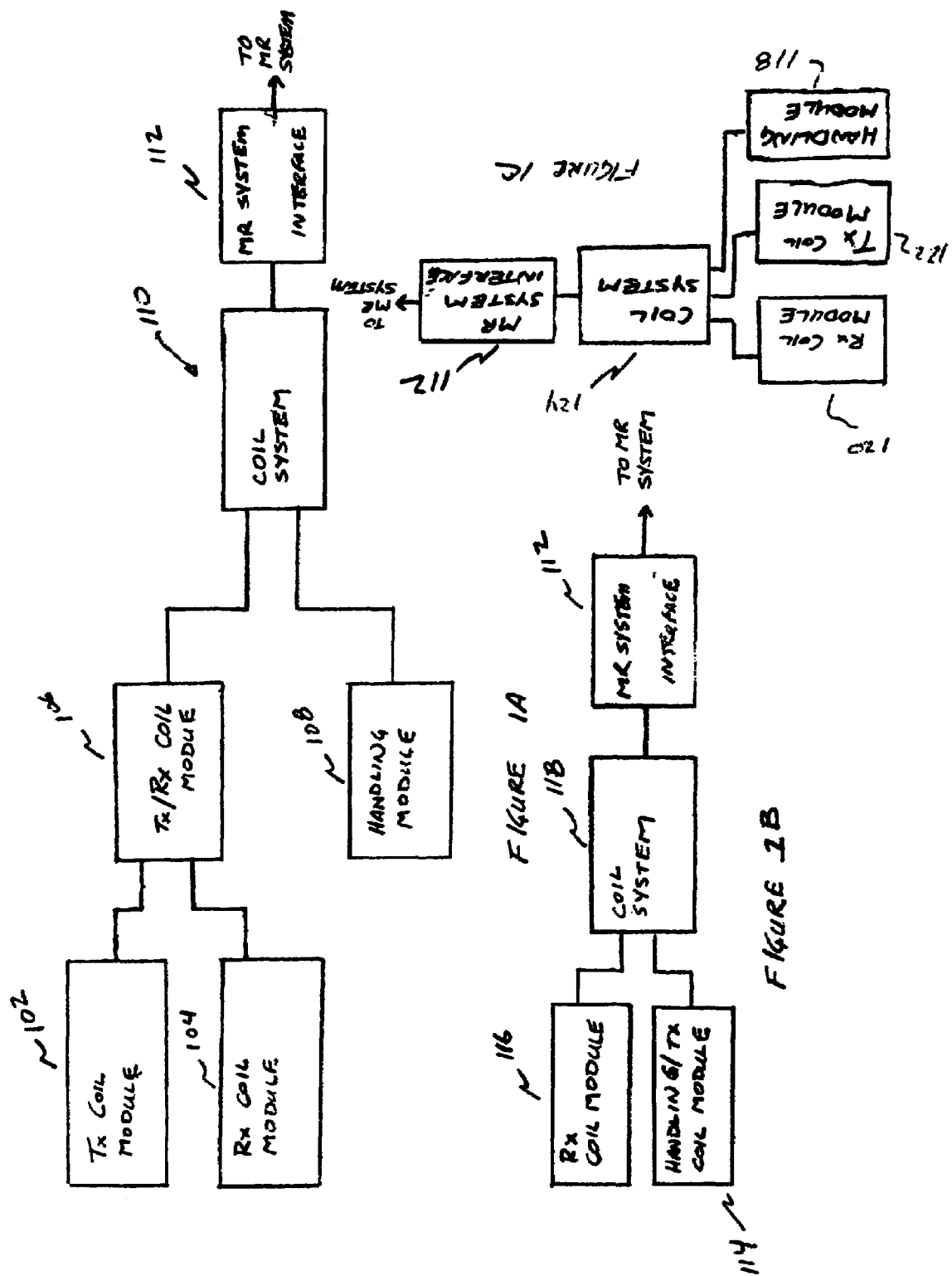

MAGNETIC RESONANCE COIL SYSTEM

BACKGROUND

The present application relates to magnetic resonance (MR) imaging and spectroscopy. It finds particular application transmit and receive coil systems for use with MR systems, and also to cryogenic coils for the MR examination of animals.

MR examination techniques have proven to be a valuable technique for obtaining information about the internal structure and function of an object under examination. A particularly successful application of MR has been the clinical imaging of humans. Still another application for MR is so-called pre-clinical imaging, in which mice, rats, and other small animals are imaged in connection with ongoing medical research. Information from such research can, in turn, be used to develop potentially life-saving treatments for use with human patients.

One limitation on the utility of the images and other information generated by MR scanners is the effect of electrical noise. Indeed, signal to noise ratio (SNR) is a key parameter used to evaluate the quality of the information generated by an MR scanner.

Various techniques have been used to improve MR system SNR. As increasing the strength of the main magnetic field increases the quality of the resultant MR signals, there has been an ongoing trend toward the use of scanners having ever higher field strengths. However, systems incorporating higher field strength magnets are generally more complex, larger, and more expensive than lower field strength systems. Additionally, their sensitivity to certain forms of artifacts may rise with rising magnetic field strength such that the optimum solution may in some cases lie in the highest SNR study at the lowest possible field strength. Even for a system operating at a given field strength, however, it remains desirable to provide a relatively higher SNR.

Cryogenic RF receive coils have been used to improve MR system SNR. These coils have been implemented using high temperature superconductor (HTS) material or cold copper (i.e., copper or oxygen free copper coils cooled near to or below liquid nitrogen temperatures) to both reduce the coil resistance and thermal noise. While cryogenic coils have favorable noise characteristics, they tend to be relatively larger and more complex than comparable warm coils.

At the same time, pre-clinical and small animal applications can present their own set of challenges. For example, animal scanners tend to have relatively smaller imaging regions than those of scanners designed for use with larger objects, such as humans. As a result, the space available for the RF coils and animal handling components is typically rather limited. These geometric considerations also complicate coil system positioning and animal handling.

Still another factor is the variety of MR scanners and applications. For example, MR scanners are available at a variety of main magnetic field strengths. As the Larmor frequency of the MR active nuclei under examination is a function of the field strength, the RF coils must be tuned for use at the desired field strength. Even at a given field strength, various applications may require the examination of different MR active nuclei or the use of RF coils having different fields of view or other performance characteristics. Accordingly, it is desirable to provide coil systems which can readily accommodate these varying requirements.

SUMMARY

Aspects of the present invention address these matters, and others.

According to a first aspect of the present invention, a modular coil system for use with an MR system includes a first RF coil module and a second module. The first RF coil module includes a cryogenic RF coil carried by the first module. The RF coil excites magnetic resonance in MR active nuclei and receives magnetic resonance signals from MR active nuclei. The first RF coil module also includes first RF coil electrical circuitry carried by the first RF coil module and operatively electrically connected to the first RF coil. The second module includes a sample receiving region and a sample support carried by the second module and which supports a sample in the sample receiving region. The first RF coil module and the second module are selectively assembleable by a human user so as to form the coil system, and the coil system is selectively insertable by a human user in the examination region of the MR system for conducting an MR examination of the sample.

According to another aspect of the invention, an MR imaging method includes placing a first cryogenic RF receive coil in a coil receiving region of a sample receiving apparatus so that the first receive coil and an RF transmit coil cooperate to define an MR signal excitation and detection region in a sample receiving region of the sample receiving apparatus. The method also includes placing a sample in the MR signal excitation and detection region, placing the sample receiving apparatus in the examination region of an MR imaging system, conducting an MR imaging examination of the sample, and removing the sample receiving apparatus from the MR imaging system.

According to another aspect, an apparatus for use in MR examinations includes a base, an RF transmit coil, a cryogenic RF receive coil mounted in relation to the transmit coil and the base so as to define a MR signal excitation and detection region, and a sample support carried by the base. The sample support is adapted to support a sample in the defined signal excitation and detection region. The apparatus is selectively insertable by a human user in the examination region of an MR system so that that the MR signal excitation and detection region is located therein.

According to another aspect, an apparatus includes a housing which defines an evacuated region, an MR RF coil disposed in the evacuated region, and a hermetically sealed, non-magnetic electrical feedthrough extending through the housing.

According to another aspect, an apparatus includes a cryogenic region, an MR RF coil disposed in the cryogenic region, and a substantially RF transparent, thermally reflective thermal radiation barrier disposed physically between the cryogenic region and the ambient environment.

According to still another aspect, an apparatus includes an MR RF coil, a variable reactor electrically connected to the RF coil, wherein the variable reactor includes an element which travels over range of motion. The apparatus also includes a rotating shaft electrically connected to the variable reactor for varying the reactance of the reactor, and a clutch operatively connected to the rotating shaft. The clutch slips when the variable rector reaches an end of travel.

Those skilled in the art will appreciate still other aspects of the present invention upon reading and understanding the attached figures and description.

FIGURES

The present invention is illustrated by way of example and not limited to the figures of the accompanying drawings, in which like references indicate similar elements and in which:

FIG. 1 depicts an MR system.

FIGS. 1A, 1B, and 1C depict embodiments of a modular MR coil system.

DESCRIPTION

Figure 1:
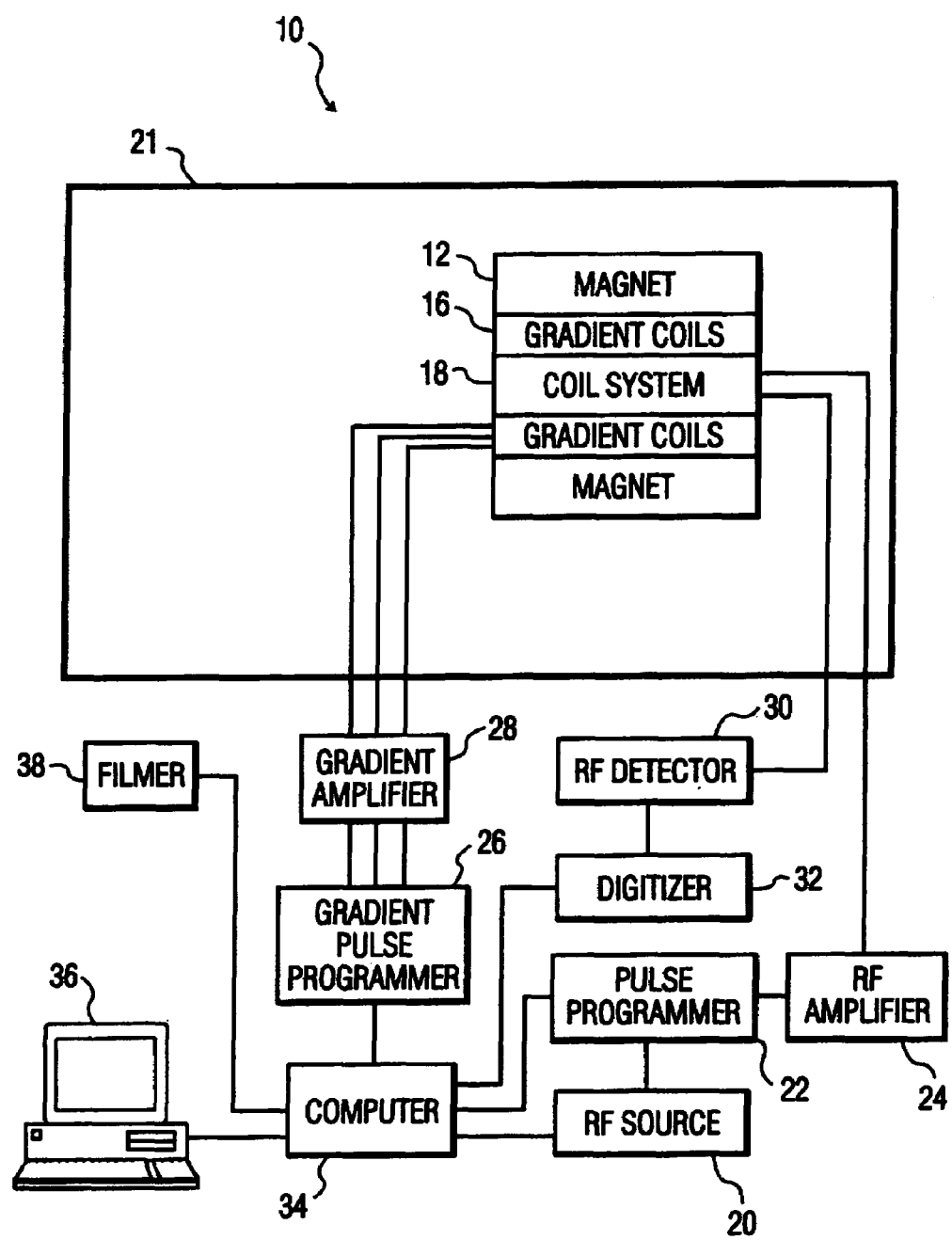

With reference to FIG. 1, an MR scanner 10 adapted for the MR examination of small animals includes a main magnet 12 which produces a substantially homogeneous, temporally constant main magnetic field $B_0$ in an examination region. As described, the main magnet is a superconducting, solenoidal magnet system. Depending on the desired main magnetic field strength and the requirements of a particular application, however, various magnet technologies (e.g., superconducting, resistive, or permanent magnet technologies) and physical magnet configurations (e.g., solenoidal or open magnet configurations) may be implemented.

Disposed in the bore of the magnet 12 is a generally cylindrical gradient coil 16. The gradient coil 16 typically includes x, y, and z-gradient coils which generate time varying gradient magnetic fields along mutually orthogonal x, y, and z-axes. A radio frequency (RF) coil system 18 is removably inserted in the bore of the gradient coil 16. With additional reference to FIGS. 1A, 1B, and 1C, and as will be described in further detail below, the coil system 18 is a modular system in which various coil and handling modules are assembled to form the coil system 18. More particularly, the coil system 18 is preferably configured so that desired modules can be selected and readily assembled by a user of the MR system based on application specific requirements and readily installed on the MR system 10 for use in a desired procedure or series of procedures.

Returning now to FIG. 1, the magnet 12, gradient coil 16, and coil system 18 are typically located in a magnetically and radio frequency shielded enclosure 21.

An RF source 20 generates an RF signal having a desired frequency (e.g., the Larmor frequency of the MR active nuclei under investigation), a pulse programmer 22 shapes the RF signals, and an RF amplifier 24 amplifies the shaped signals to the levels required by the transmit coil for exciting nuclei in an object under examination. A gradient pulse programmer 26 establishes the shape and amplitude of the desired time varying magnetic fields, and a gradient amplifier 28 amplifies these signals to the levels required by the respective x, y, and z gradient coils 16. An RF detector 30 receives and amplifies the signals generated by the receive coil. The signals are, in turn, converted to digital form by a digitizer 32.

One or more computers 34 associated with the scanner 10 coordinate the operation of the gradient and RF systems, for example to generate desired pulse sequences. The signals generated by the digitizer 32 are further processed to generate spectroscopic or volumetric image data indicative of the object. An operator console 36 includes human perceptible input and output devices, such as a keyboard, mouse, and display or monitor. The console 36 allows the operator to interact with the scanner, for example by selecting desired pulse sequences and other desired examination protocols, initiating and terminating scans, and viewing and otherwise manipulating the volumetric data. A filmer or other hard copy device 38 may be used to provide images of the volumetric data.

The modules or components of a first modular coil system 18 are shown in FIG. 1A. An RF transmit coil module 102 includes an RF transmit coil which excites magnetic resonance in MR active nuclei disposed in an excitation region. A RF receive coil module 104 includes an RF receive coil which detects MR signals from an MR active nuclei in a detection region. The transmit 102 and receive 104 coil modules are, in turn, assembled to form a combined transmit/receive coil module 106.

To further support the modularity of the system, the transmit coil module 102 advantageously carries RF coil electrical circuitry, such as tuning and matching circuitry which are optimized or otherwise appropriate for the particular RF transmit coil. Similarly, the RF receive coil module 104 carries RF coil electrical circuitry, such as one or more of decoupling circuitry, a combiner (in the case of a quadrature coil), and one or more preamplifiers, which are optimized or otherwise appropriate for the particular RF receive coil module 104. The modules 102, 104 carry electrical connectors which allow the modules to be connected to the MR system or otherwise to a higher level assembly in the coil system. In one implementation, an RF receive coil module 104 includes a cryogenic RF receive coil which provides a relatively higher SNR than a conventional room temperature coil.

The mechanical configurations of the transmit coil module 102 and the receive coil module 104 are such that the two modules are readily assembled by a user of the MR system to form a unitary transmit/receive coil module 106. The mechanical and electrical characteristics of the modules 102, 104 are such that, when assembled, the excitation region and the detection regions coincide. In this sense, it should be understood that the two regions need not be precisely coextensive, but rather that the excitation and detection regions coincide over a common excitation and detection region. In one exemplary application, the common excitation and detection region may be of a geometry which is optimized for examining the brain of a mouse.

A handling module 108 includes an object or sample receiving region and a coil receiving region. The handling module 108 also includes a sample support which is configured to support a region of interest of the sample in an examination region. In the exemplary mouse neural imaging application, the sample support would be configured to support the head of the mouse in the examination region.

The mechanical and electrical characteristics of the transmit/receive coil module 106 and the handling module 108 are such that the modules may be readily assembled by a user of the MR system to form a unitary RF coil system 110. In addition, the mechanical and electrical characteristics of the modules 106, 108 are such that, when assembled, the excitation region and detection region and the examination region coincide. In addition, the handling module 108 is configured so as to be compatible with the electrical connector(s) from the transmit/receive coil module 106.

The coil system 110 is, in turn, configured so that the assembled coil system is readily installed and/or removed in the examination region of the MR scanner 10 by the user.

While the transmit/receive coil module 106 has been described as being assembled from a transmit coil module 102 and a receive coil module 104, the transmit/receive coil module 106 may also be configured as a single, integrated module. Such an arrangement is particularly well-suited to applications in which a single RF coil functions as both a transmit and a receive coil.

To further support the modularity of the coil system 110, an MR system interface 112 may also be provided to provide a requisite electrical and mechanical interface between the coil system 100 and the inputs and/or outputs of a particular MR system. Such an arrangement is particularly useful where a given family of coil systems is designed to operate in conjunction with different models of MR system, with MR systems from different vendors, where a user wishes to use a particular coil system with more than one MR system, or where different outputs and/or signal processing are required for various applications, such as pre-clinical, clinical, or other applications.

FIG. 1B depicts the modules or components of a second modular coil system configuration. As shown in FIG. 1B, the transmit coil module 104 and the handling module 108 are combined in an integrated handling/transmit coil module 114. The mechanical and electrical configuration of the RF transmit coil and the sample support are such that the excitation and examination regions coincide.

The receive coil module 116 functions substantially as described above. However, the mechanical and electrical characteristics of the receive coil module 116 and the integrated handling/transmit coil module 114 are such that the modules may be readily assembled by a user of the MR system to form a unitary RF coil system 118. Such an arrangement is well suited to situations in which a single transmit coil is likely to be suitable for a relatively wide variety of applications.

FIG. 1C depicts the modules or components of a third modular coil system 18. Rather than being assembled to form a combined transmit/receive coil module as described above in connection with FIG. 1A, the receive coil module 120 and the transmit coil module 122 are assembled with the handling module 118 so as to form the coil system 124. Thus, for example, the receive coil module 120 and the handling module 118 are assembled to form a first sub-assembly, and the transmit coil module 122 is installed on the sub-assembly to form the coil system 124. Again, the mechanical and electrical characteristics of the receive coil module 116, the transmit coil module 122, and the handling module 118 are such that the modules may be readily assembled by a user of the MR system to form a unitary RF coil system 118. It should be noted that a particular coil system may be optimized for operation at a given main magnetic field strength. A particular coil system may also include various modules which are tuned or otherwise designed to operate at different field strengths. In applications where SNR is particularly important, the coil system may include a module which includes a cryogenic RF receive coil.

The signal produced by the receive coil includes a sample noise component and a coil noise component. To reduce coil noise and to improve overall SNR, the coil system preferably includes at least one module having a cryogenic RF receive coil. The relative sample and coil noise contributions are a function of various interrelated factors, including the frequency of interest (which is, in turn, a function of the main magnetic field strength and the nuclei under examination), the configuration and field of view of the receive coil(s), and the distance between the receive coil(s) and the sample, and the characteristics of the sample. Ideally, the coil system is configured so that the sample noise predominates over the coil noise at the frequency of interest.

Figure 2:
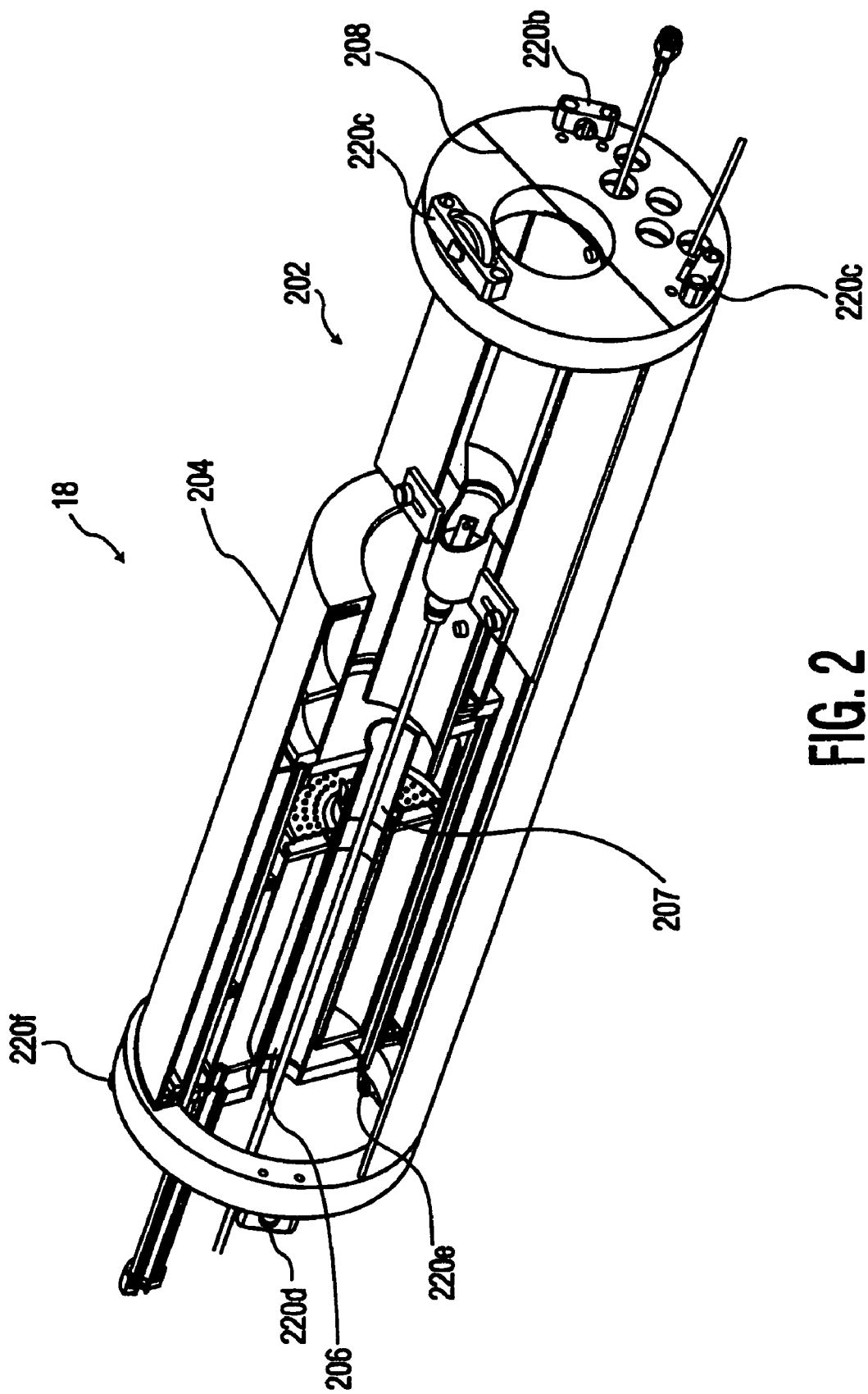
FIG. 2 is a perspective, partial cutaway view of an exemplary MR coil system.

FIG. 2 depicts an exemplary coil system 18 designed for the examination of small animals. In one implementation, the coil system is configured for the examination of hydrogen nuclei at 9.4 T, although other frequencies and MR active nuclei are contemplated. The coil system 18 includes an animal receiving module 202, a transmit coil module 204, and a receive coil module 206. The coil system 18 has an outer diameter 208 which allows the user to selectively insert the coil system 18 in the bore of the gradient coil 16 so that an imaging region 207 of the coil system 18 is located in the examination region of the MR scanner. In one embodiment adapted for use with a gradient coil 16 having an inner diameter of 120 millimeters (mm), the coil system 18 has an outer diameter of about 119 mm, although other suitable dimensions and clearances are contemplated. User adjustable, outwardly extending setscrews 220a, 220b, 220c, 220d, 220e, 220f allow the coil system 18 to be selectively secured in relation to the gradient coil 16. Other techniques for securing the coil system 18, such as latches, user-removable fasteners, and the like, may also be used. A portion of the coil system 18 may also have a dimension greater than that of the bore of the gradient coil, in which case the coil system may be selectively secured to the exterior of the gradient coil 16.

In one embodiment, the transmit coil module 204 and the receive coil module 206 are assembled by the user so as to form a combined transmit/receive coil module. The transmit/receive coil module is, in turn, selectively assembled with the animal receiving module 202 to form the coil system 18. A particular advantage to such an arrangement is that the performance characteristics of the coil system 18 can be modified to meet the requirements of a particular application, for example by replacing one or more of the modules with a module having a different performance characteristic, or by modifying one or more of the modules.

Figure 3:
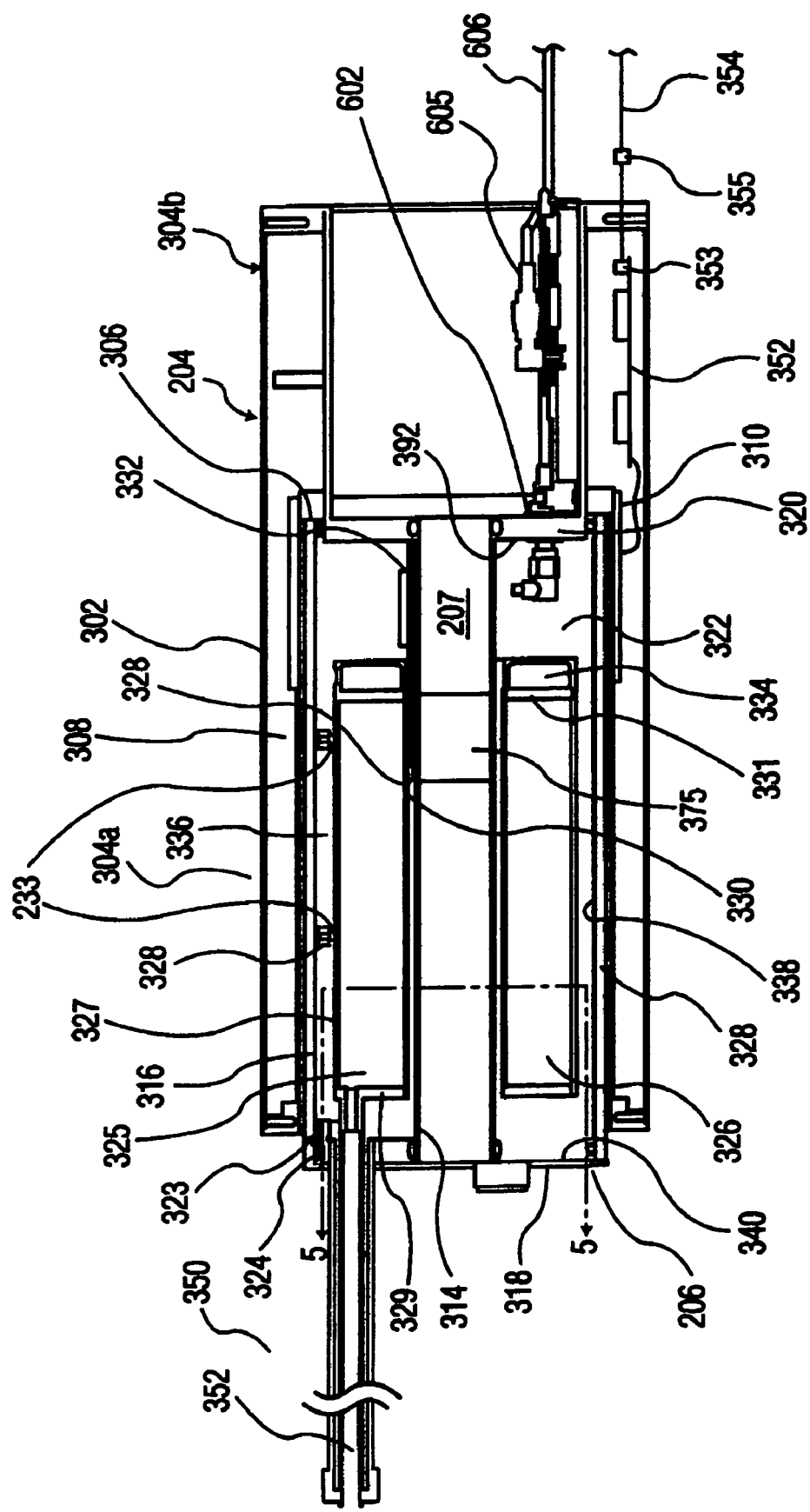
FIG. 3 is a side, cutaway view of a transmit coil module and a receive coil module.

With additional reference to FIG. 3, an exemplary transmit coil module 204 includes concentric, generally cylindrical outer 302 and inner 304 housing portions which define a generally annular region therebetween. A distal portion 304a of the inner housing 304 has a relatively larger inner diameter than a proximal portion 304b. The interface between the distal 304a and proximal 304b portions defines an inwardly, radially extending surface or step 306. In one embodiment, the transmit coil module has an outer diameter of 112 mm, the distal portion 304a has an inner diameter of the 90 mm, and the proximal portion 304b has an inner diameter of 72 mm.

A transmit coil 310 which excites magnetic resonance in a first examination region 207 is disposed in the annular region between the inner 302 and outer 304 housing portions. Transmit coil tuning and matching circuitry 352, including one or more variable reactors such as capacitors 353, is disposed in the annular region of the proximal portion 302b. Rotatably adjustable tuning rods 354 extend from the proximal end of the transmit coil 204 so as to allow a user to adjust the variable capacitors 353 when the transmit coil 204 is installed in the gradient coil 16. Mechanical clutches 355 mounted on the tuning rods 204 allow the tuning rods 354 to slip when the variable capacitors 353 reach the end of their adjustment range, thus reducing the likelihood of damage to the capacitors should the user attempt to turn a tuning rod past a capacitor's 353 adjustment range. More particularly, the clutches 355 selectively couple the tuning rod 354 to the capacitors when the applied torque is in the range of the capacitor's normal operating torque. When the applied torque exceeds the normal operating range, as typically occurs when the capacitor reaches the end of its travel, the clutch begins to slip. Note that pulley or other arrangements which provide the desired torque characteristics may also be employed either in lieu of or in conjunction with the clutches. Suitable electrical connectors (not shown) also extend from the proximal end to allow the transmit coil 204 to be removably connected to the RF amplifier 204 of the MR system, whether directly or through an associated interface unit.

With continuing reference to FIGS. 2 and 3, an exemplary cryogenic receive coil module 206 is removably insertable in the distal end of the transmit coil module 204. The receive coil module 206 includes concentric, generally cylindrical inner 314 and outer 316 housing portions and first 318 and second 320 end caps define a generally annular evacuated region 322. In one embodiment, the receive coil module 206 has in outer diameter of 89 mm. In an embodiment particularly well suited to neural imaging of mice, the inner housing 314 has an inner diameter of 21 mm.

An electrical strip heater 375 may be disposed around the inner surface of the inner housing in a position distally displaced from the examination region 207. The heater 375 aids in maintaining the imaging region 207 at or relatively near to room temperature, which is particularly useful when imaging live animals.

The housings 314, 316 and end caps 318, 320 are preferably fabricated from an MR and structurally compatible material, such as high purity (e.g., 99.8%) alumina ($Al_2O_3$), although fiberglass laminate, such as G10, or other suitable materials, could also be used. Note that the thickness of the inner housing 314 is preferably minimized to allow a receive coil 332 to be positioned close to the examination region 207. O-ring seals 324 and epoxy 323 at the various joints provide a vacuum tight seal. When the receive coil module 206 is installed in the transmit coil module 204, the second end cap 320 seats against the radially extending surface 306 to facilitate positioning of the receive coil module 206 in a known position with respect to the transmit coil module 204 so that the associated coils cooperate to excite and detect magnetic resonance signals in an examination region.

A heat sink, such as a generally annular liquid nitrogen (LN2) reservoir or dewar 326, is disposed in the vacuum region 322, although other shapes for the LN2 dewar that conform to the region where the LN2 reservoir will be located are also acceptable. The dewar 326, which is again fabricated from high purity alumina, includes generally cylindrical inner 325 and outer 327 walls and first 329 and second 331 end caps. To reduce thermal conduction between the dewar 326 and the external environment, thermal standoffs 328 support the dewar 326 in the vacuum region 322. More particularly, the dewar 326 is supported by a plurality of polyamide setscrews 323 which extend from the standoffs 328 to engage the dewar 326 at a corresponding plurality of substantially point contacts. To further reduce thermal conduction to the inner environment, the inner surface 325 of the dewar 326 is preferably spaced away from the receive coil inner housing 314. A molecular sieve 334 carried by the dewar 326 adsorbs gases or other contaminants present in the vacuum region 322 and becomes a cryopump which improves the vacuum and increases the lifetime of the dewar. The molecular sieve will increase the amount of times between service events where the vacuum is refreshed with a vacuum pump.

An alumina receive coil holder 328 which subtends a portion of a cylindrical arc is epoxied to the inner surface 330 of the dewar 326. The coil holder 328 extends proximally into the vacuum region 322 in the direction of the first examination region 207. An RF receive coil 332 is disposed on the holder 328. Hence, the dewar 326 serves as a heat sink for cooling the receive coil 332 to the desired temperature. In one implementation, the receive coil 332 is fabricated from copper, although the use of high temperature superconductor (HTS) or other superconducting materials is contemplated.

The RF receive coil 332 is configured to image a desired portion of an object disposed in the examination region 207. In an embodiment particularly well suited for the neural imaging of mice, the RF receive coil 332 is implemented as a linear surface coil. As noted above, receive coil modules 204 having various receive coil configurations, such as quadrature, volume, and phased array, may be provided depending on the requirements of a particular application.

The use of low emissivity surfaces reduces thermal radiation losses between cold portions of the receive coil module 206 and the external environment. More particularly, thermally reflective radiation barriers 336, 338, 340, 342 are adhered to the respective inner surfaces of the inner housing 314, the outer housing 316, the first end cap 318, and the second end cap 320 using double sided adhesive. Alternatively or additionally, thermally reflective radiation barriers may also be applied to the respective outer surfaces. As the thermal radiation barrier operates in the presence of RF energy and time varying gradient magnetic fields, the radiation barriers should preferably be substantially transparent to RF energy and relatively unsusceptible to eddy currents.

In one implementation, the radiation barrier is a thin, non-metallic, polymeric specular reflective film, such as Vikuiti™ Enhanced Specular Reflector (ESR) material, part number 98-0440-0955-7, available from Minnesota Mining and Manufacturing Co. (3M) of St. Paul, Minn., USA. The Vikuiti material is a multi-layer, polyethylene napthalate (PEN) film having a nominal thickness of approximately 65 microns (μm) and a nominal shrinkage of <1% (15 minutes at 150° Celsius). The material is more fully described in U.S. Pat. No. 5,882,774, issued Mar. 16, 1999, and entitled Optical Film, which patent is expressly incorporated by reference in its entirety herein.

Figure 4:
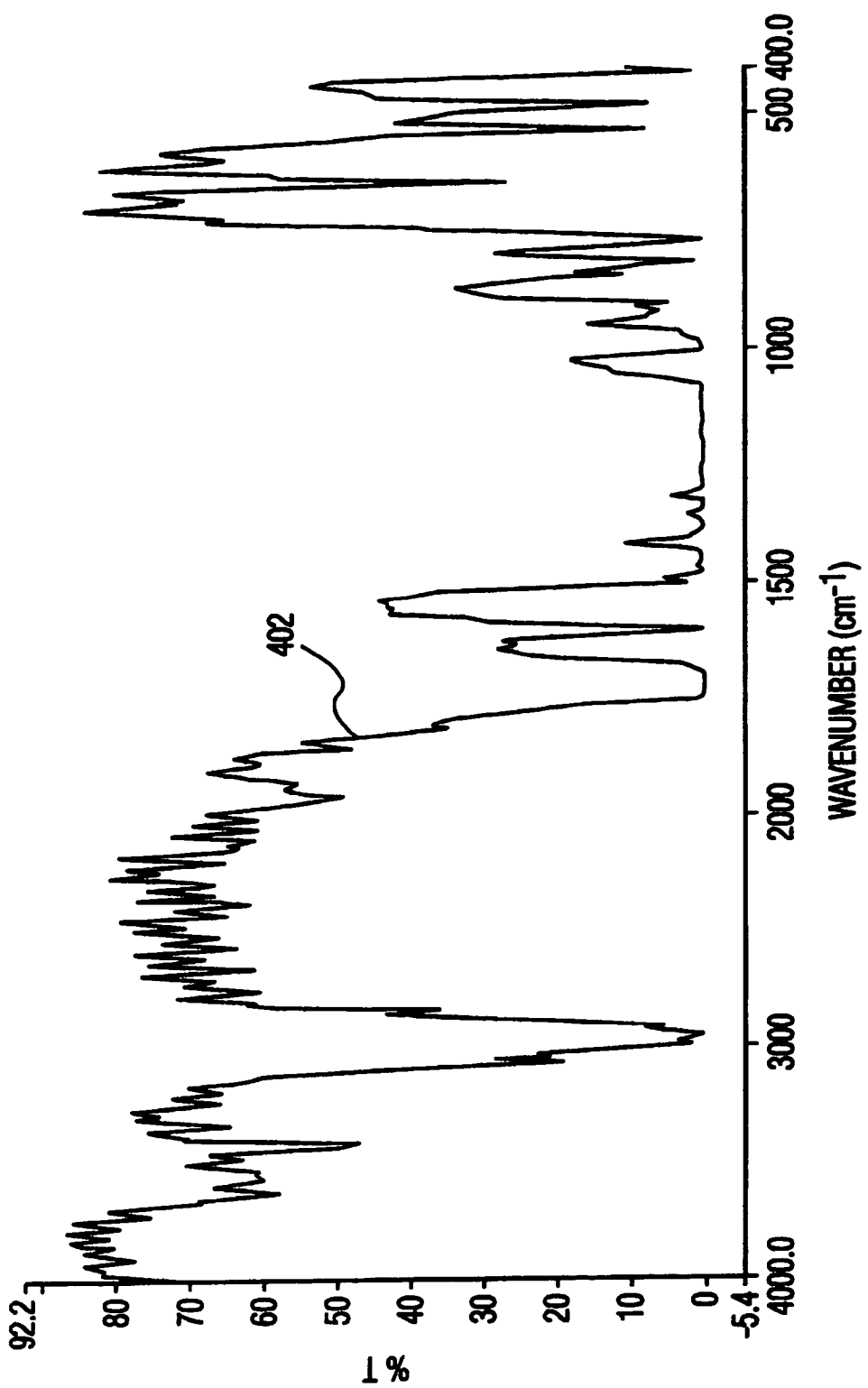
FIG. 4 depicts a Fourier transmission infrared (FTIR) spectrum of a thermal radiation barrier.

The measured Fourier transform infrared (FTIR) spectrum 402 of the Vikuiti material is depicted in FIG. 4, where the abscissa represents the wavenumber in $cm^{-1}$ and the ordinate represents the transmission in percent (%). While the material is largely transmissive of radiation over a range of wavenumbers (e.g., greater than about 1700 $cm^{-1}$ and less than about 750 $cm^{-1}$), it is largely non-transmissive of infrared radiation having wavenumbers between about 750 $cm^{-1}$ and 1700 $cm^{-1}$, which corresponds roughly to the blackbody emission spectrum of substantially room temperature objects. Accordingly, the material can be used as a thermal radiation barrier between the external environment and the cold regions of the receive coil module 206.

In another implementation, the radiation barrier may be fabricated from a metalized polymer film, such as aluminized polyethylene terepthelate (PET) (sometimes referred to as aluminized Mylar™). As the metal layer otherwise absorbs radio frequency (RF) energy, microfractures are preferably introduced into the material so as to render it substantially electrically transparent to RF energy of the frequencies encountered during the MR experiment. This may be accomplished by crinkling or otherwise mechanically deforming the material to generate the microfractures. If desired, the RF transmissivity of the mechanically deformed material can be verified prior to installation.

Figure 5:
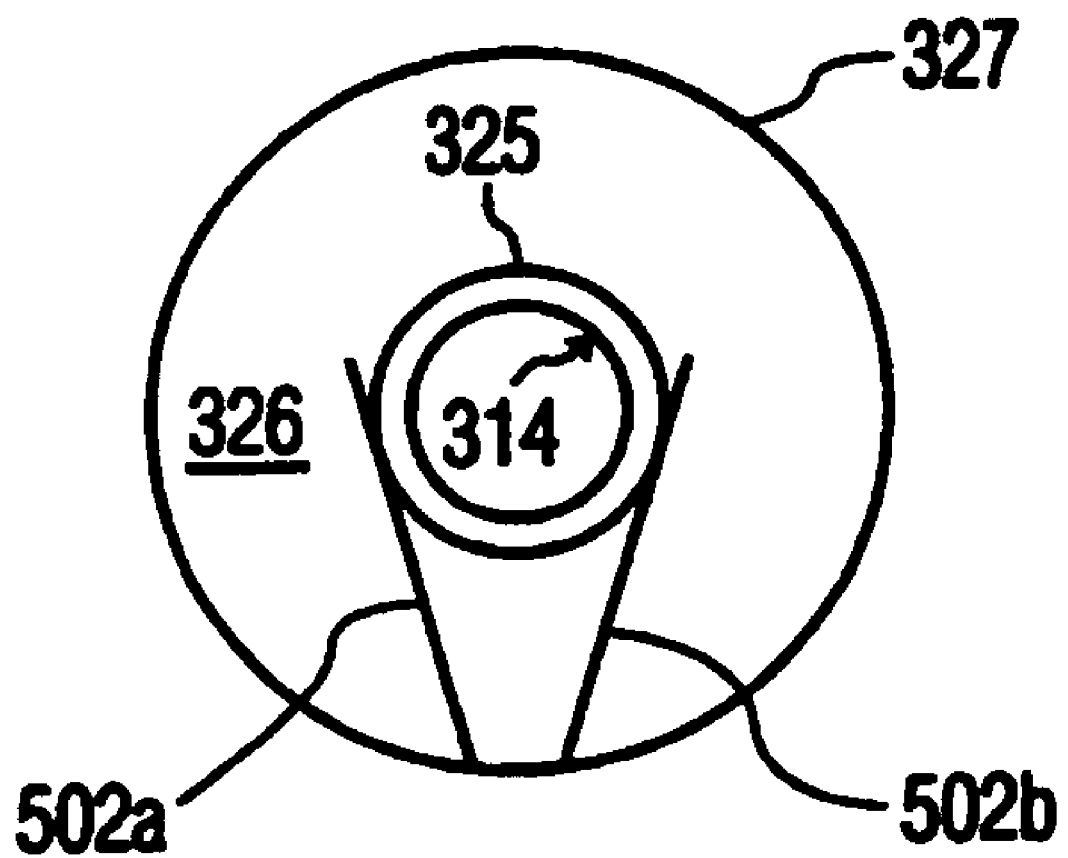
FIG. 5 is a sectional view along the line 5-5 of FIG. 3.

With additional reference to FIG. 5, thermally conductive fins or struts 502a, 502b (not shown in FIGS. 2 and 3 for clarity of illustration) fabricated from a material, such as alumina or sapphire, are disposed in thermal communication with the inner dewar housing 325. The struts extend downwardly toward the outer dewar housing 327. The fins 502a, 502b, which are epoxied to and run longitudinally along substantially the length of the dewar 326, provide a thermally conductive path between the cryogen contained in the lower portion of the dewar and the inner dewar housing 325. The thermally conductive path becomes especially useful as the cryogen level falls below that of the inner housing 325.

To provide additional thermal contact area, flats may be machined or otherwise formed on the sides of the dewar housing 325, or corresponding arcs may be formed in the fins 502a, 502b. Rather than intersecting the inner dewar housing 325 along a tangent as shown in FIG. 5, a fin may (either alternatively or additionally) extend vertically downwardly from the inner 325 to the outer 327 dewar housing.

Returning now to FIGS. 2 and 3, a cryogen port 350 fabricated from fiberglass laminate, such as G10 or other suitable material, allows the cryogen to be introduced into the dewar 326. A generally cylindrical piece of open cell foam is removably inserted into the port 350 so that cryogen which boils off during operation of the coil vents to the atmosphere. The length and insulation of the cryogen port 350 are advantageously selected to avoid or reduce visible condensation resulting from the vented cryogen and to reduce splashing or spilling of the LN2.

Figure 6:
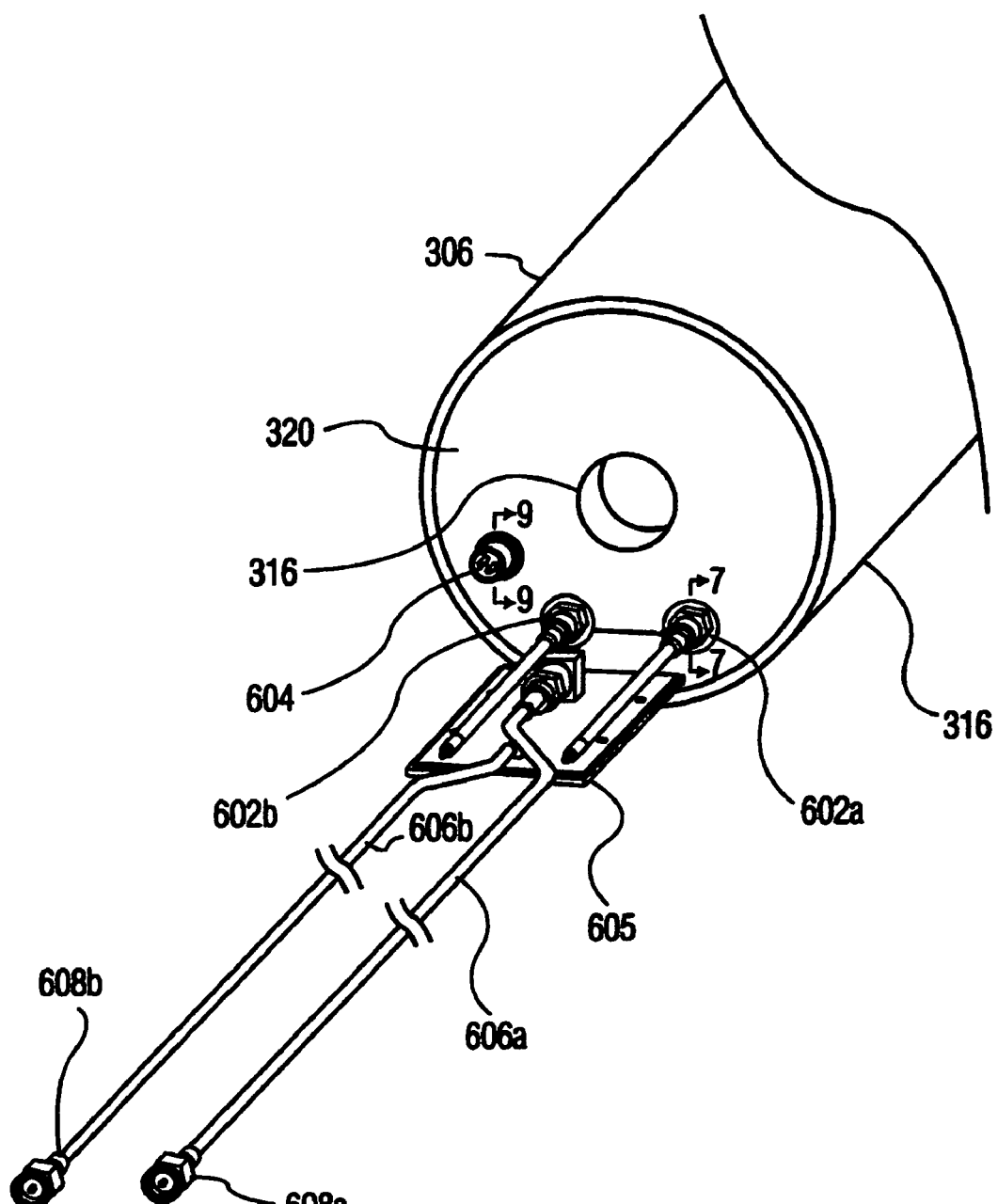
FIG. 6 is a perspective view of a receive coil module.

With additional reference to FIG. 6, electrical utilities are provided at the proximal end of the receive coil module 206. First 602a and second 602b hermetically sealed, non-magnetic RF feedthroughs extend through the proximal end cap 320 to the vacuum region 322. A hermetically sealed, non-magnetic, substantially low frequency or otherwise direct current (DC) feedthrough likewise extends through the proximal end cap 320.

The RF feedthroughs 602 provide a portion of the electrically conductive path between the receive coil 332 and receive coil electrical circuitry 605. The receive coil electrical circuitry 605, which is mounted to the receive coil module 306, advantageously includes one or more of decoupling circuitry, a combiner in the case of a quadrature coil, and one or more preamplifiers. Where the receive coil 332 is a quadrature coil, the RF feedthroughs 602a, 602b are preferably mounted symmetrically with respect to the receive coil 332 and the circuitry 604 so as to provide electrical connection paths having similar lengths. The RF outputs are provided via electrical conductors 606a, 606b and connectors 608a, 608b which extend proximally from the receive coil module 206 so that the receive coil module 206 may be removably electrically connected to the RF receiver 30 of the MR imaging system. As will be appreciated by those skilled in the art, a receive coil module 206 which includes a quadrature coil 310 and a combiner, or a single coil, would ordinarily include a single RF output. A receive coil module 206 which includes a plurality of coils 310, for example in the case of an array coil, would ordinarily include a corresponding plurality of RF outputs.

The DC feedthrough 604 provides a portion of an electrically conductive path between the receive coil 332 and the MR system. More particularly, the DC feedthrough carries electrical signals used for transmit/receive decoupling, tuning, and similar control functions relevant to the operation of the receive coil 332. Electrical conductors and an electrical connector (not shown in FIG. 6 for clarity of illustration) extend from the DC feedthrough 604 so that the receive coil module 206 may be removably electrically connected to the MR system.

As noted above, the electrical feedthroughs 602, 604 extend to the vacuum region 322. Accordingly, it is desirable that that the feedthroughs 602, 604 provide a substantially vacuum-tight seal between the evacuated region 322 and the ambient environment. As the feedthroughs are within several centimeters of the first imaging region 207, it is also desirable that the feedthroughs be non-magnetic so as not to interfere with the MR procedure.

Figure 7:
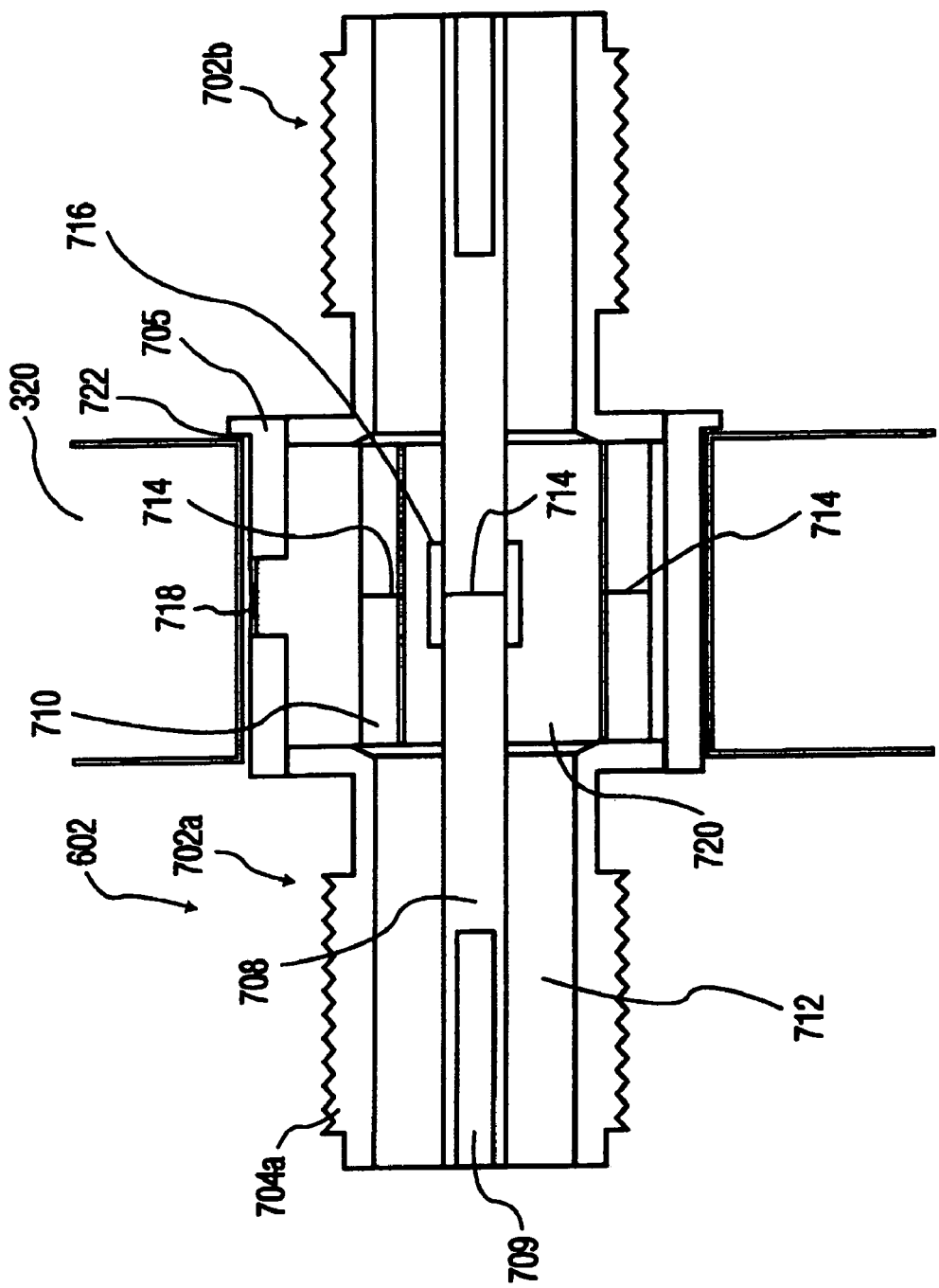
FIG. 7 is a sectional view of a radio frequency (RF) feedthrough along the line 7-7 of FIG. 6.

Turning now to FIG. 7, construction of the RF feedthroughs 602 will be described in greater detail. In the illustrated embodiment, the feedthrough 602 includes first 702a and second 702b non-magnetic fifty ohm (50Ω) non-magnetic female subminiature version A (SMA) connectors and a cylindrical sleeve 705. The sleeve 704 may be machined from brass or otherwise fabricated from a substantially non-magnetic material. The use of connectors 702 which have nickel or other similar plating should be avoided, as the plating deleteriously affects the magnetic properties of the connectors.

The connectors 702 include a threaded body portion 704, electrically conductive legs 606, and a center conductor 708. The center conductor includes a female portion 709 which accepts the male portion of a mating male connector. The opposite end of the center conductor 708 is ordinarily soldered to a printed circuit board. An outer connector body 704 is disposed coaxially with respect to the center conductor 708. The connector body 704 includes a threaded portion 704a which engages the mating male connector and a plurality of legs 710 which would ordinarily be soldered to a printed circuit board. A dielectric 712, such as PTFE, is located in the annular region between the connector body 704 and the center conductor 708. Unfortunately, however, the individual connectors 704a, 704b do not provide a suitable vacuum-tight seal.

Solder joints 714 provide an electrical connection between the corresponding center conductors 708 and the legs 710 of the first 702a and second 702b connectors. Additionally, or alternately, a conductive epoxy 716 may be used. A potting compound, such as a non-conductive epoxy 720, fills the spaces between the various conductors and the sleeve 705. The epoxy 720 extends into radially extending holes 718 in the sleeve 705, which provide additional structural integrity, particularly against rotational and longitudinal forces. As will be appreciated, the epoxy provides a hermetic seal between the first 702a and second 702b connectors.

To assemble the RF feedthrough 602, the first 702a and second 702b connectors are first soldered together. The sleeve 705 is positioned over the solder joints, and the epoxy 730 is then injected through the holes 718 into the resultant cavity and allowed to cure. The connector is then epoxied or otherwise sealingly fastened to the proximal end cap 720. A lip 722 on the sleeve 705 facilitates positioning of the feedthrough.

Figure 8:
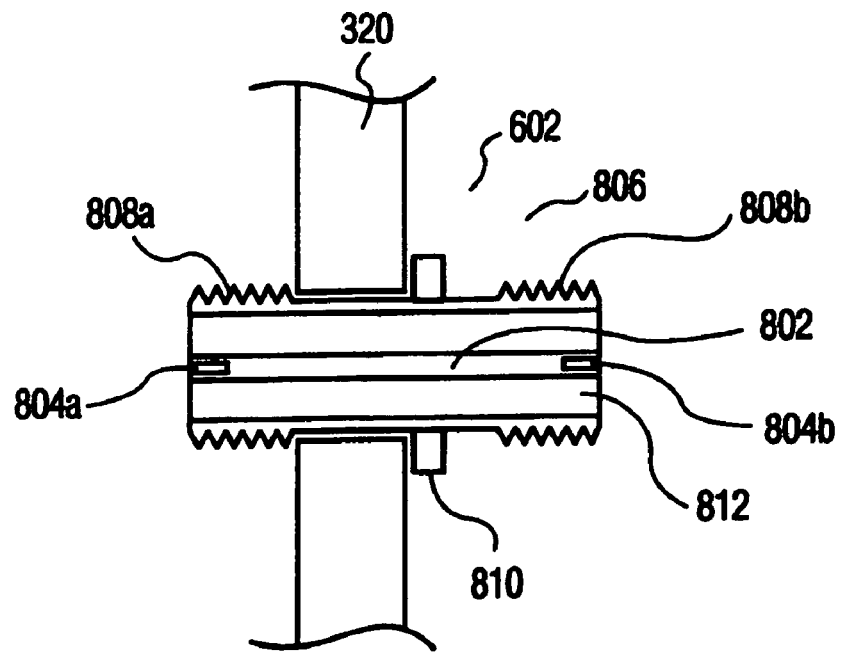
FIG. 8 is a sectional view of an RF feedthrough.

An alternate embodiment of the RF connectors 602 is shown in FIG. 8. A center conductor 802 machined or otherwise fabricated from a suitable non-magnetic electrical conductor, such as brass, copper, beryllium copper or the like, extends between the first and second ends of the connector 602. Where plated, the conductor 802 should be plated with a non-magnetic material, such as gold. The central conductor 802 includes material free regions 804a, 804b which matingly engage the central conductors of corresponding male connectors. A generally cylindrical outer connector body 806 fabricated from a suitable non-magnetic electrical conductor is disposed coaxially with respect to the center conductor 802. The connector body 806 includes threaded portions 808a, 808b which engage corresponding mating male connectors. A radially extending portion 810 of the connector body 806 provides a lip which facilitates positioning of the connector 602 to the end cap 320. A potting compound 812, such as epoxy, fills the region between the central conductor 802 and the outer connector body 806 so as to provide a hermetic seal. The outer body 806 may also be provided with radially extending holes as described above in relation to the embodiment of FIG. 7. Note that the relative radial dimensions of the center conductor 802 and the connector body 806 are selected so that, in conjunction with the dielectric constant of the potting compound 812, the connector 602 has a characteristic impedance of approximately 50 ohms or other desired value. While the conductor 602 has been described as a female-female connector, one or both of the connector ends may be configured as a male connector.

Figure 9:
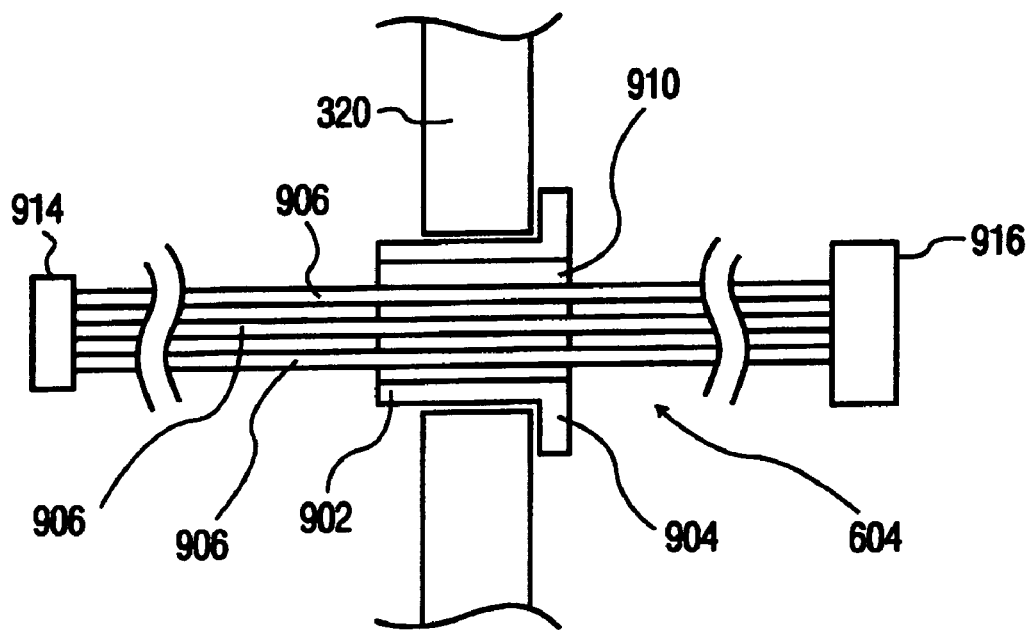
FIG. 9 is a sectional view of a direct current (DC) feedthrough along the line 9-9 of FIG. 6.

With reference to FIG. 9, construction of the DC feedthrough 604 will now be described in greater detail. The connector includes a generally cylindrical sleeve 902 which is machined from a suitable non-magnetic material, such as brass, titanium, aluminum, copper or the like. As the sleeve 902 does not form a portion of an electrically conductive path, it should be noted that the sleeve 902 may also be fabricated from a polymer, ceramic, or other suitable non-electrically conductive material. A radially extending portion 904 facilitates positioning of the feedthrough 604, which is epoxied or otherwise sealingly attached to the end cap 320.

A desired plurality of electrical conductors 906 extend longitudinally through the sleeve 902. Advantageously, the conductors 906 are fabricated from solid (i.e., non-stranded) wire or wire insulated with a polyimide such as Kapton®, which is available from Minnesota Mining and Manufacturing Company (3M) of St. Paul, Minn. The conductors themselves should also be non-magnetic, such as copper or beryllium copper, in order to avoid disturbing the MR signal collection process. An epoxy or other suitable potting compound 910 fills the interior of the sleeve 902 so as to provide a hermetic seal. Electrical connectors 914, 916 located at the proximal ends of the conductors 906 allow the conductors 906 to be selectively connected to the receive coil 332 and the MRI system, respectively. While other wire insulation may be used, a particular advantage of the polyimide insulation over other materials is that the polyimide tends to bond well to both the wires 906 and the potting compound 910, thereby facilitating the fabrication of a hermetically sealed feedthrough.

Fabrication of the feedthrough 604 is facilitated by the use of fixtures having a plurality of spaced apart apertures. More particularly, a fixture is located at each end of the feedthrough. The wires are threaded through the apertures, which aid in maintaining the spacing between the conductors 906 as they pass through the sleeve 904. The fixtures are advantageously removed following injection of the potting compound 910.

Figure 10:
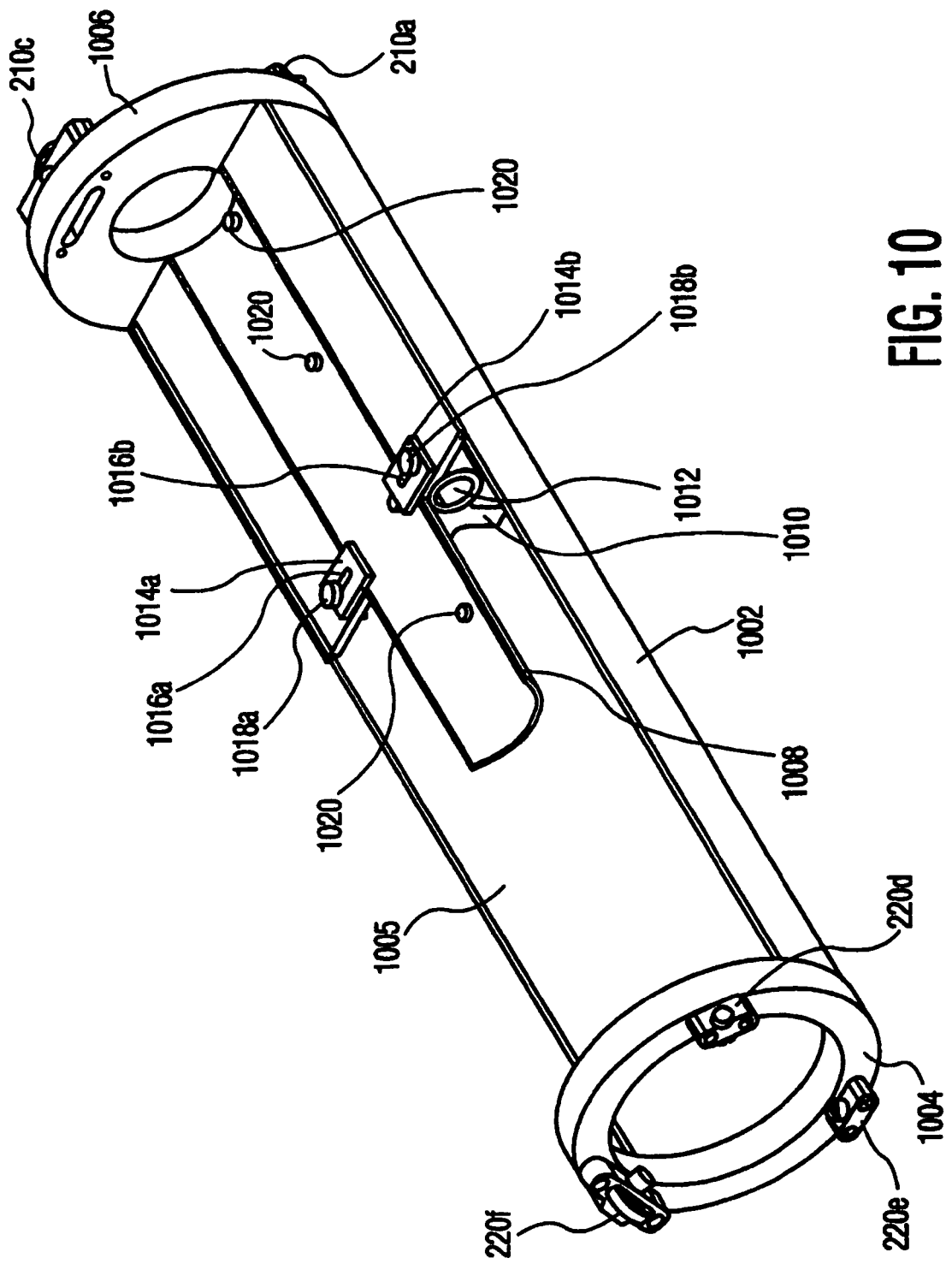
FIG. 10 is a perspective view of an animal receiving module.
Figure 11:
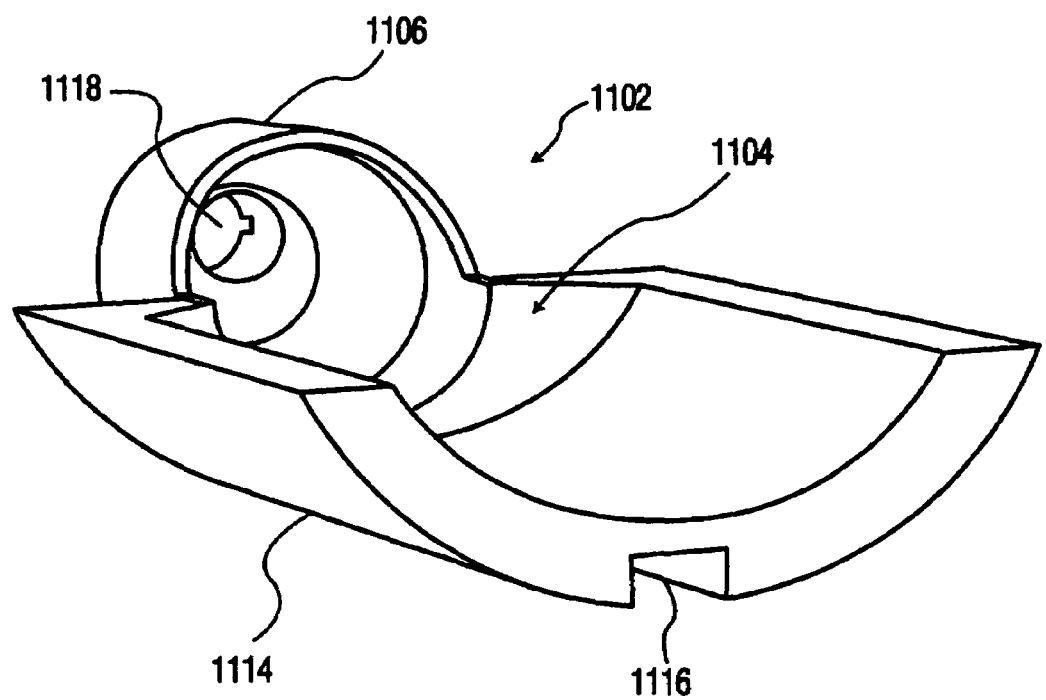
FIG. 11 is a perspective view of an animal support.

Turning now to FIG. 10, the animal receiving module 202 includes an outer housing 1002, a distal end plate 1004, a proximal end plate 1006, and an animal support 1008. The outer housing 1002 has an outer dimension which allows the first examination region 207 to be located in the bore of a generally cylindrical gradient coil 16. The module also includes a coil receiving region 1005 having a diameter which allows the transmit coil module 204 to be selectively inserted therein. The distal end plate 1004 is selectively attachable to the housing 1002 so as to facilitate insertion and removal of the transmit coil module 204. Note that the distal end plate 1004 may also be carried by the transmit coil module 204. One or both of the end plates 1004, 1006 may also be omitted.

The animal support 1008 is supported in the outer housing by a support member 1010. The support member 1010 is includes apertures 1012 and material free regions which allow the tuning rods 354, the conductors 710, and the connectors 608 to pass therethrough when the transmit coil module 204 and the receive coil module are inserted in the animal receiving module 202.

The animal support 1008, which subtends a portion of a cylindrical arc, extends longitudinally from the proximal end of the animal receiving module 202 in the direction of the transmit coil receiving region 1005. First 1014a and second 1014b locking plates are mounted for radial motion with respect to the animal support 1008. More particularly, slots 1016a, 1016b operating in conjunction with thumbscrews 1018a, 1018b allow the locking plates 1014 to be selectively held in a desired position. As will be described below, the locking plates 1014 allow an animal support to be selectively held at a desired longitudinal position which is typically located at the isocenter or otherwise in the imaging region of the MR system. Locating pins 1020 or ridges engage a corresponding slot in the animal support so as to reduce rotational motion of the animal bed 1102 in relation to the animal support 1008.

With reference now to FIG. 10, an animal support 1102 includes an animal supporting surface 1104 for supporting a mouse or other object to be imaged. The support 1102 includes a nosepiece 1106 having a generally conical interior cross section which, in the illustrated embodiment, is adapted to receive the mouse's head. An outer surface 1114 of the support 1102 is dimensioned to be supported by the animal support 1008 for longitudinal motion with respect thereto. A groove or slot 1116 engages the locating pins 920. An aperture 1108 allows an extension rod 1110 of a bite bar 1112 to be inserted therethrough. A user operable locknut 1118 allows the user to selectively position the bite bar 1112 in relation to the animal support 1102.

In one embodiment, the aperture 1108 is located above the center of the conical cross section portion so that the animal's head is received nearer to the top of the nosepiece. As the receive coil 332 is, in the illustrated embodiment, located above the first examination region 207, such an arrangement has the beneficial effect of locating the animal's head relatively nearer to the receive coil 332, thus improving the fill factor. As a further aid to positioning of the animal's head nearer to the coil 332, the interior cross section may be asymmetrical. It should be noted that the locating pins 920 and the groove 916 aid in maintaining the desired rotational orientation of the animal support 1102.

Other variations are contemplated. While the MR system has been described in relation to the imaging of hydrogen nuclei in a 9.4 T MR system, the transmit 310 and receive 332 coils may be tuned for use at other field strengths or in connection with other MR active nuclei.

The coil system 18 may also be adapted for use with so-called vertical field magnets or other non-solenoidal magnet geometries, or in clinical or other human imaging.

In another embodiment, a family of coil modules may be provided. Thus, for example, a plurality of receive coil modules 206 may be provided, each having receive coils 332 with differing imaging characteristics selected based on application specific requirements. Thus, for example, a first receive coil module 206 may include a quadrature surface coil, a second may include a multi-element phased array coil, another may include a volume coil, and so on. A family of transmit coil modules 204 may also be provided, as may a family of animal receive modules 202

In still another embodiment, the separate transmit 204 and receive 206 coil modules may be implemented as a combined transmit and receive coil disposed in a single module, which may be designed to operate at cryogenic or warm temperatures (or a combination of both), depending on application specific requirements. The transmit coil may also be integrated with the animal receiving module 202. In yet another embodiment, the receive coil module 206 may be implemented as a conventional room temperature coil.

Figure 12:
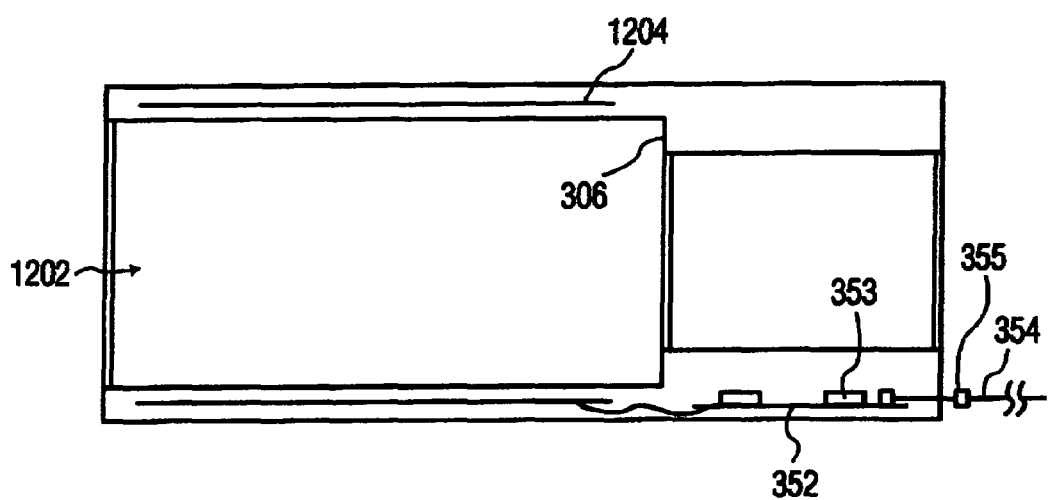
FIG. 12 is a side, cutaway view of a transmit coil module.

In yet another implementation particularly well suited for imaging of relatively larger animals, the animal may be inserted in the distal end 1202 of the transmit coil module 1204 as illustrated in FIG. 12. In such an arrangement, the transmit coil 1206 may advantageously be configured to have a field of view having a relatively greater longitudinal field of view than that described in relation to the transmit coil module 204 described above. A warm receive coil (not shown) may then be positioned in relation to the animal. A dedicated animal support may also be provided. A particular advantage of such an arrangement is that the transmit coil tuning and matching circuitry 352 may be carried at the proximal end, while the relatively larger interior dimension of the distal end 1202 facilitates the imaging of larger animals or otherwise improves access to the animal for a given coil module 206 exterior dimension.

While the cooling system has been described in relation to an open loop system using a cryogen, such as LN2, closed loop or other cooling systems may also be used. Exemplary closed loop systems include cryocoolers, such as Joule Thomson coolers, Gifford-McMahon coolers, Stirling cryocoolers, pulse tubes, or the like. In such an implementation, the cold head would ordinarily be located so as to be in thermal communication with the coil support 330 via a thermally conductive material, such as sapphire or copper. One advantage of such an arrangement is that it provides additional options for the dewar or heat sink geometry.

In another variation which is particularly advantageous when working with immunocompromised animals, the coil system 18 may be provided with a cover or covers which minimize contamination of the coil system 18 or the animal during handling. In the illustrated embodiment, the animal receiving region at the proximal end of the coil system 18 would be provided with a suitable cover. The various other apertures may also be plugged or otherwise sealed. To further reduce contamination of the animals, the coil system 18 may be provided with suitable fittings which allow the coil system 18 to be connected to an air source so that the animal receiving region is maintained at a positive pressure. The various interior components of the coil system 18 may also be fabricated from or housed in covers fabricated from materials which are compatible with gaseous or other decontamination chemicals, thus facilitating sterilization of the coil system 18 or its various components.

Operation of the exemplary coil system described above will now be described with reference to FIGS. 13 and 13A. With reference first to FIG. 13A, operation generally includes configuring the coil system 1300A, cooling the cryogenic portion 1300B, installing the coil system on the MR system 1300C (and subsequently de-installing it), connecting the coil system to the MR system interface or otherwise to the MR system 1300D, and generating an application specific output 1300E. While the foregoing description has focused on the neural imaging of mice, other pre-clinical and clinical applications are contemplated. Thus, for example, the coil system may be used in connection with MR/PET, MR/SPECT, or other similar systems. The coil system may also be used in conjunction with other MR applications, such as molecular imaging, fMRI, and the like.

Figure 13:
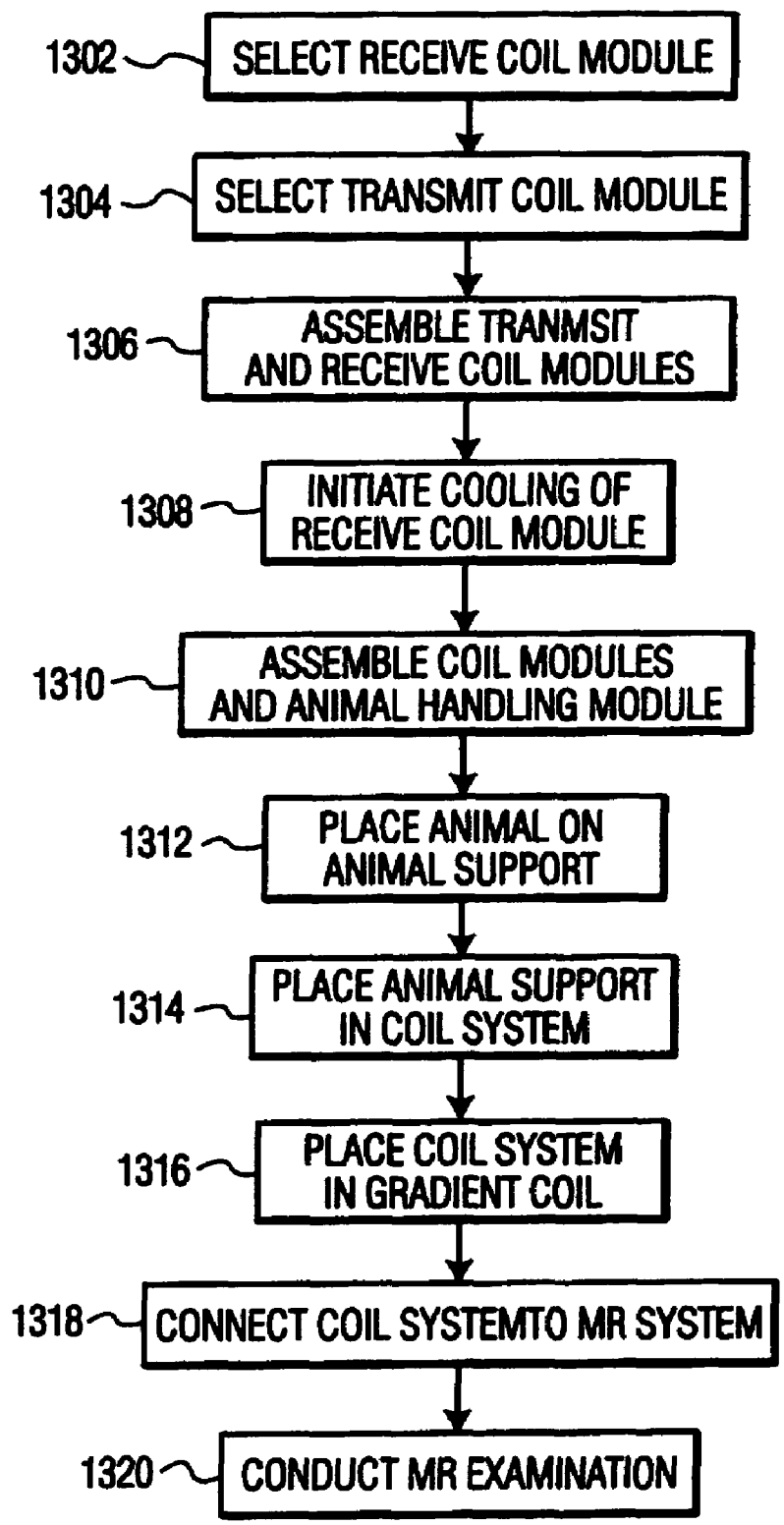
FIG. 13 depicts steps in the use of an MR coil system.
Figure 13A:
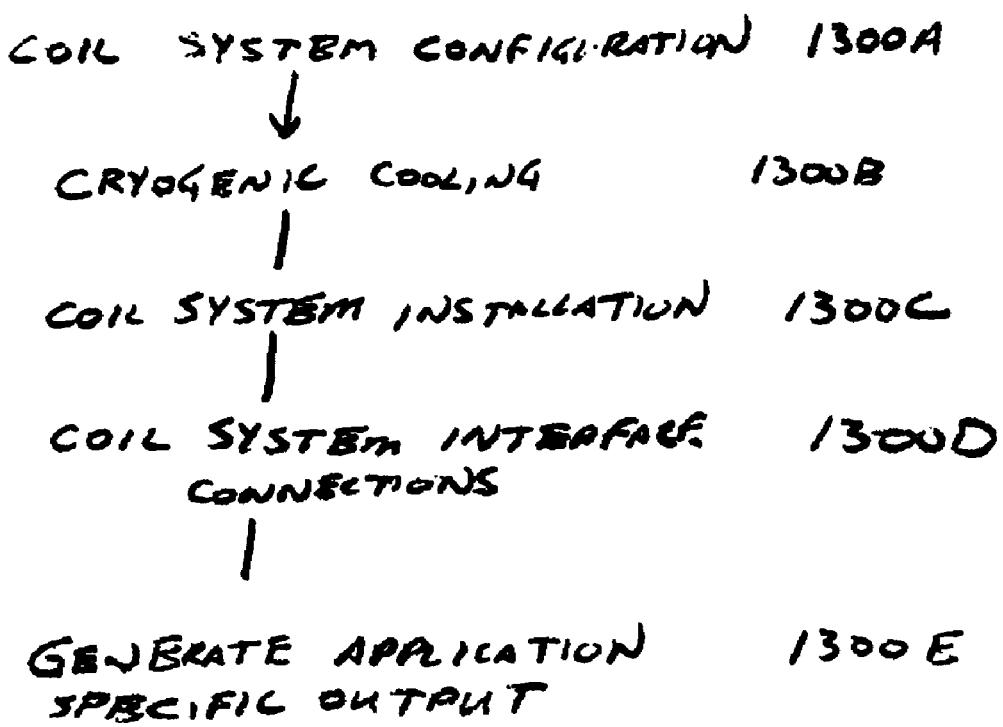
FIG. 13A depicts steps in an MR examination.

With reference to FIG. 13, the user selects a receive coil module 206 for use at step 1302. Where the receive coil module 206 is one of a family of such modules, the user would ordinarily select a receive coil module 206 designed for use at a field strength which corresponds to that of the user's MR system and for examining the MR active nuclei of interest. The user would also select a receive coil module having a field of view or other performance characteristics most suitable for a desired application. In the case of neural imaging of a mouse, for example, the user might choose a coil module including a quadrature surface coil.

At step 1304, the user selects a desired transmit coil module 204, again based on factors, such as the field strength, the nuclei of interest, and the performance characteristics of the transmit coil.

At step 1306, the user assembles the transmit coil module 204 and the receive coil modules. In the embodiment shown in FIG. 2, for example, the user would ordinarily insert the receive coil module 204 in the distal end of the transmit coil module 206 until the proximal end of the receive coil module 206 contacts the surface 306 and so that the various conductors 606 and connectors 608 extend through the proximal end of the transmit coil module 204. The user would then secure the receive coil module 206 in position using the distal end plate 1004.

Where the user has selected a low temperature receive coil module 206, cooling of the receive coil module is initiated at step 1308.

Where the receive coil module includes a cryogen port 350 and dewar 326 as described above in relation to FIG. 2, a suitable cryogen, such as LN2, is introduced into the cryogen port 350 until the dewar 326 is substantially filled. The receive coil 332 is then cooled via thermal conduction through the coil support 330. A particular advantage of the illustrated arrangement is that the thermal stresses on the receive coil 332 and its electrical components are reduced compared to arrangements in which the receive coil 332 is immersed in or otherwise substantially in contact with a cryogen bath. Still another advantage is that thermal and electrical instabilities resulting from the boil-off of the cryogen are reduced. Note that the cooling may be initiated at other points in the process, for example prior to step 1306 or after assembly of the transmit/receive coil to the animal support module 202.

At step 1310, the user assembles the transmit and receive coil modules 204, 206 and the animal receiving module 202. In the illustrated embodiment, and with particular reference to FIG. 10, the user inserts the coil modules 204, 206 into the transmit coil receiving region 1005 from the distal end of the animal receiving module 202. More particularly, the coil modules are slid substantially longitudinally with respect to the animal receiving module so that the various conductors 606, connectors 608, and turning rods 354 protrude through the proximal end cap 1006. The coil modules 204, 206 are secured to the animal receiving module 202 by the distal end plate 1004.

At step 1312, the animal is positioned on the animal support 1104, for example using the bite bar 1112. The bite bar 1112 may also be positioned in relation to the nosecone 1018 using the bite bar extension 1110, which is then secured in position. Physiological measurement devices, such as respiration monitors, cardiac monitors, thermometers, as well as heating pads, anesthesia devices and other desired accessories, may also be provided.

At step 1314, the animal support 1104 is positioned in the coil system. In the illustrated embodiment, the animal support 1104 is inserted from the proximal end of the coil system 18 so that the bite bar extension 1110 extends out the distal end. The animal support is then positioned longitudinally so that the region of interest of the object being imaged is positioned in the first imaging region 207. In the case of neural imaging of a mouse, for example, the head of the mouse would ordinarily be positioned in the imaging region. The locking plates 1016 and thumbscrews 1018 may be used to secure the animal support 1104 at the desired position. Note that the support 1104 may be secured to a degree which resists gross motion of the support 1104 but allows the user to further adjust the support 1104 as needed.

One advantage of the described arrangement is that handling of the animal is relatively simplified. When working with immunocompromised animals, for example, it is generally desirable to minimize the exposure of the animal to environmental pathogens. Thus, the user may elect to position the animal on the patient support 1104 in a relatively protected environment in proximity to the vivarium. The patient support 1104 may then be transported to the vicinity of the coil and MR scanner in a suitable enclosure and readily positioned in the coil system 18. As the coil system 18 is also relatively portable, the user may also elect to transport the coil system 18 to the vivarium or other relatively protected area for positioning the animal support 1104 therein.

At step 1316, the coil system 18 is positioned in the gradient coil 16. More particularly, the coil system 18 is advantageously inserted so that the imaging region of the coil system 18 is located at the isocenter of the MR system. In this regard, it should be noted that the coil system 18 need not be inserted entirely within the gradient coil 16; some or all of the coil system may extend from or both of the gradient coil 16 ends. The coil system 18 may also be provided with one or more stops which facilitate positioning of the coil system 18 at a desired position. The coil system 18 may be secured in the desired position using the setscrews 220.

At step 1318, the user connects the various electrical connectors to the MR system. The user also uses the tuning rods 354 to tune the transmit coils as desired.

The desired MR examination is conducted at step 1320. Upon completion of the scan, the coil system 18 may be removed from the gradient coil 16 and the process repeated as desired.

Those skilled in the art will also recognize that the steps for assembling and using the coil system 18 will vary based on implementation of the coil system 18, for example where the transmit coil is integrated with the animal receiving module 204.

Of course, modifications and alterations will occur to others upon reading and understanding the preceding description. It is intended that the invention be construed as including all such modifications and alterations insofar as they come within the scope of the appended claims or the equivalents thereof.

What is claimed is:

1. A modular coil system for use with an MR system having a main magnet and a gradient coil, the coil system including:
   a first RF coil module which includes
      a cryogenic RF coil carried by the first module and which at least one of excites magnetic resonance in MR active nuclei and receives magnetic resonance signals from MR active nuclei, wherein the cryogenic RF coil is configured for operation at a cryogenic temperature during the at least one of the excitation of magnetic resonance in the MR active nuclei and the reception of the magnetic resonance signals;
      first RF coil electrical circuitry carried by the first RF coil module and operatively electrically connected to the first RF coil;
   a second module which includes
      a sample receiving region;
      a sample support carried by the second module and which supports a sample in the sample receiving region;
   wherein the first RF coil module and the second module are selectively assembleable by a human user so as to form the coil system, wherein the coil system is selectively insertable by a human user in the examination region of the MR system for conducting an MR examination of the sample.

2. The apparatus of claim 1 wherein the MR system is a non-human animal scanner having a generally cylindrical gradient coil having a bore and wherein the coil system is selectively insertable in the bore.

3. The coil system of claim 1 wherein the first RF coil module includes
   a first transmit coil module which includes an RF transmit coil which excites magnetic resonance in MR active nuclei in a signal excitation region;
   a first receive coil module which includes a cryogenic RF receive coil which detects magnetic signals from MR active nuclei in a signal detection region;
   wherein the first transmit coil module and the first receive coil module are selectively assembleable by a human user so as to form the first RF coil module.

4. The coil system of claim 3 wherein the first transmit coil module and the first receive coil module matingly engage so as to form a unitary assembly, and wherein when the first transmit coil module and the first receive coil module are so mated, the signal excitation region and the signal detection region are coextensive.

5. The coil system of claim 4 wherein the first RF coil module and the second module matingly engage so as to form a unitary assembly, and wherein the MR coil system is selectively removable from the MR system by a human user.

6. The coil system of claim 1 wherein the second module includes an RF transmit coil, the first RF coil module includes a cryogenic RF receive coil, and the first RF coil electrical circuitry includes at least one of decoupling circuitry, a quadrature combiner, and a preamplifier.

7. The coil system of claim 1 wherein the RF coil receives MR signals from MR active nuclei in a signal detection region, and wherein the sample support is selectively positionable with respect to the second module for positioning a region of interest of a sample in the signal detection region.

8. The coil system of claim 1 including a third RF coil module which includes
a third RF coil having a functional characteristic which is different from that of the first RF coil;
third RF coil electrical circuitry operatively connected to the second RF coil and carried by the third RF coil module,
wherein either of the first RF coil module or the third RF coil module and the second module are selectively assembleable by a human user so as to form the coil system.

9. The coil system of claim 1 wherein the gradient coil includes a generally cylindrical bore and wherein the coil system includes a generally cylindrical exterior shape, whereby the coil system is selectively insertable in the bore.

10. The coil system of claim 1 wherein sample support is a small animal support.

11. The coil system of claim 10 including a cover which selectively covers the sample receiving region so as to minimize contamination of an animal supported by the small animal support.

12. The coil system of claim 1 wherein the sample support includes a bite bar.

13. The coil system of claim 1 wherein the RF coil is a receive coil which produces a signal which includes sample noise and coil noise, and wherein sample noise predominates over coil noise.

14. The apparatus of claim 1 wherein the first RF coil module includes an evacuated region and a hermetically sealed, non-magnetic electrical feedthrough extending between the evacuated region and the ambient environment.

15. The apparatus of claim 1 wherein the first RF coil includes a cryogenic region, and wherein the first RF coil module includes a substantially RF transparent, thermally reflective radiation barrier disposed between the cryogenic region and the ambient environment.

16. The apparatus of claim 15 wherein the radiation barrier is fabricated from a metalized polymer having a plurality of microfractures, and wherein the microfractures render the radiation barrier substantially RF transparent.

17. The apparatus of claim 15 wherein the radiation barrier is fabricated from a non-metallic, polymeric thermally reflective film.

18. The apparatus of claim 1 wherein the coil system includes a variable reactor, a shaft operatively connected to the variable reactor for varying its reactance, and a clutch operatively connected to the rod.

19. The apparatus of claim 1 wherein the MR system is one of a hybrid MR/SPECT or a hybrid MR/PET system.

20. The apparatus of claim 1 wherein the MR system is a non-human animal imaging system.

21. The apparatus of claim 1 wherein the first RF coil module includes an evacuated region and the cryogenic coil system is disposed in the evacuated region.

22. The apparatus of claim 1 including means for cryogenically cooling the cryogenic RF coil.

23. The apparatus of claim 1 including means for maintaining the sample receiving region at a positive pressure.

24. An MR imaging method comprising:
placing a first cryogenic RF receive coil in a coil receiving region of a sample receiving apparatus so that the first receive coil and an RF transmit coil cooperate to define an MR signal excitation and detection region in a sample receiving region of the sample receiving apparatus;
placing a sample in the MR signal excitation and detection region;
placing the sample receiving apparatus in the examination region of an MR imaging system;
while operating the cryogenic RF coil at a cryogenic temperature, conducting an MR imaging examination of the sample;
removing the sample receiving apparatus from the MR imaging system.

25. The apparatus of claim 24 including
removing the sample from the MR signal excitation and detection region;
removing the first RF receive coil from the coil receiving region;
placing a second, non-cryogenic RF receive coil in the coil receiving region.

26. The method of claim 24 including, prior to placing the first RF receive coil in the coil receiving region of the sample receiving apparatus, placing the first receive coil in a receive coil receiving region of the transmit coil.

27. The method of claim 24 wherein the first cryogenic receive coil produces a signal which includes sample noise and coil noise, and wherein the sample noise predominates over the coil noise.

28. The method of claim 24 including initiating a cryogenic cooling of the first cryogenic receive coil prior to placing the first cryogenic RF receive coil in the coil receiving region.

29. The method of claim 24 wherein initiating a cooling includes introducing a cryogen into a dewar which is in thermal communication with the first cryogenic RF receive coil.

30. The method of claim 24 wherein the sample is a small animal.

31. The method of claim 30 including
placing the small animal on a small animal support;
placing the small animal support in the sample receiving region.

32. The method of claim 24 wherein the sample is a living organism and including heating the sample receiving region during the MR imaging examination.

33. The method of claim 24 including maintaining the sample receiving region at a positive pressure during the MR examination.

34. The method of claim 33 wherein the sample is an immunocompromised animal.

35. The method of claim 24 wherein the MR imaging system is a non-human animal scanner.

36. The method of claim 24 wherein the MR imaging examination is one of an fMRI or a molecular imaging examination.

37. The method of claim 24 including securing the coil system to the housing of a generally cylindrical gradient coil.

38. An apparatus for use in MR examinations comprising:
a base;
an RF transmit coil;
a cryogenic region;
a cryogenic RF receive coil disposed in the cryogenic region for operation at a cryogenic temperature and mounted in relation to the transmit coil and the base so as to define an MR signal excitation and detection region;

a sample support carried by the base, which support is adapted to support a sample in the defined signal excitation and detection region;

wherein the apparatus is selectively insertable by a human user in the examination region of an MR system so that that the MR signal excitation and detection region is located therein.

39. The apparatus of claim 38 wherein the receive coil is removably mounted in relation to the base for selective removal by a human user.

40. The apparatus of claim 39 wherein the sample support is a small animal support.

41. The apparatus of claim 38 wherein the transmit coil is removably mounted in relation to the base for selective removal by a human user.

42. The apparatus of claim 38 wherein the apparatus has a generally cylindrical exterior shape.

43. The apparatus of claim 42 wherein the apparatus has a longitudinal axis and the receive coil is displaced from the longitudinal axis, and wherein the apparatus includes means for urging a region of interest of the animal radially in the direction of the receive coil.

44. The apparatus of claim 38 wherein the MR system is an animal imaging system.

45. The apparatus of claim 38 wherein the transmit coil and the receive coil matingly engage so as to form a unitary assembly, and wherein the unitary assembly is selectively mountable to the base by a human user.

46. The apparatus of claim 38 including an evacuated region and a non-magnetic, annular dewar disposed in the evacuated region.

47. The apparatus of claim 46 wherein the dewar includes an inner housing portion and a thermally conductive member attached to the inner housing portion and extending downwardly therefrom, wherein the thermally conductive member includes a major surface which extends longitudinally with respect to the dewar, whereby the thermally conductive member provides a thermally conductive path between the inner housing portion and a cryogen disposed below the inner housing portion so as to aid in cooling of the inner housing portion.

48. The apparatus of claim 38 including a heater that heats the excitation and detection region.

49. An apparatus comprising:
a housing which defines an evacuated region;
an MR RF coil disposed in the evacuated region;
a hermetically sealed, non-magnetic electrical feedthrough extending through the housing, wherein the electrical feedthrough includes a sleeve fabricated from a non-magnetic material, at least a first electrical conductor extending through the sleeve, and a potting material which provides a hermetic seal between the at least a first conductor and the sleeve.

50. The apparatus of claim 49 wherein the at least a first electrical conductor is a polyimide insulated, non-magnetic wire.

51. The apparatus of claim 50 including an electrical connector connected to a first end of the wire for providing a removable electrical connection to a mating connector.

52. The apparatus of claim 49 wherein the electrical conductor is generally cylindrical and includes first and second ends, the first end includes a first material free region, the second end includes a second material free region, and the first and second material free regions are adapted to receive the conductors of corresponding first and second male electrical connectors.

53. The apparatus of claim 49 wherein the feedthrough is a coaxial feedthrough having a characteristic impedance of approximately 50 ohms.

54. The apparatus of claim 49 further including a pre-clinical MR imaging system, wherein the RF coil is operatively connected to the MR system.

55. The apparatus of claim 49 further including a clinical MR imaging system, wherein the RF coil is operatively connected to the MR system.

56. The apparatus of claim 49 wherein the RF coil is a cryogenic coil.

57. The apparatus of claim 49 including an examination region and an object support that support an animate object in the examination region.

58. An apparatus comprising:
a housing which defines an evacuated region;
an MR RF coil disposed in the evacuated region;
a hermetically sealed, non-magnetic electrical feedthrough extending through the housing;
an MR imaging system and a second imaging system, wherein the RF coil is operatively connected to the MR system.

59. An apparatus comprising:
a cryogenic region
an MR RF coil disposed in the cryogenic region for operation at a cryogenic temperature;
a substantially RF transparent, thermally reflective thermal radiation barrier disposed physically between the cryogenic region and the ambient environment.

60. The apparatus of claim 59 wherein the thermal radiation barrier is fabricated from a metalized polymer having a plurality of microfractures formed therein, wherein the microfractures render the radiation barrier substantially transparent to RF energy at an operating frequency of the RF coil.

61. The apparatus of claim 59 wherein the thermal radiation barrier is fabricated from a non-metallic polymeric film.

62. The apparatus of claim 61 wherein the film is a multi-layer polymeric film.

63. The apparatus of claim 62 wherein the film comprises PEN.

64. The apparatus of claim 59 further including a pre-clinical MR system, wherein the RF coil is operatively connected to the MR system.

65. The apparatus of claim 59 further including a clinical MR system, wherein the RF coil is operatively connected to the MR system.

66. The apparatus of claim 59 further including an MR imaging system and a second imaging system, wherein the RF coil is operatively connected to the MR system.

67. An apparatus for use in MR examinations comprising:
a base;
an RF transmit coil;
a cryogenic RF receive coil mounted in relation to the transmit coil and the base so as to define an MR signal excitation and detection region;
a sample support carried by the base, which support is adapted to support a sample in the defined signal excitation and detection region;
wherein the apparatus is selectively insertable by a human user in the examination region of an MR system so that that the MR signal excitation and detection region is located therein;
a variable reactor electrically connected to the RF coil, wherein the variable reactor includes an element which travels over range of motion;

a rotating shaft electrically connected to the variable reactor for varying the reactance of the reactor.

a clutch operatively connected to the rotating shaft, wherein the clutch slips when the variable rector reaches an end of travel.

68. The apparatus of claim 67 wherein the reactor is a variable capacitor.

69. The apparatus of claim 67 further including a pre-clinical MR system, wherein the RF coil is operatively connected to the MR system.

70. The apparatus of claim 67 further including a clinical MR system, wherein the RF coil is operatively connected to the MR system.

71. An MR imaging method comprising:

placing a first cryogenic RF receive coil in a coil receiving region of a sample receiving apparatus so that the first receive coil and an RF transmit coil cooperate to define an MR signal excitation and detection region in a sample receiving region of the sample receiving apparatus;

placing a sample in the MR signal excitation and detection region;

placing the sample receiving apparatus in the examination region of an MR imaging system;

conducting an MR imaging examination of the sample;

removing the sample receiving apparatus from the MR imaging system;

heating the sample receiving region during the MR imaging examination.

72. An MR imaging method comprising:

placing a first cryogenic RF receive coil in a coil receiving region of a sample receiving apparatus so that the first receive coil and an RF transmit coil cooperate to define an MR signal excitation and detection region in a sample receiving region of the sample receiving apparatus;

placing a sample in the MR signal excitation and detection region;

placing the sample receiving apparatus in the examination region of an MR imaging system;

conducting an MR imaging examination of the sample;

removing the sample receiving apparatus from the MR imaging system;

maintaining the sample receiving region at a positive pressure during the MR examination.

73. An apparatus for use in MR examinations comprising:

a base;

an RF transmit coil;

a cryogenic RF receive coil mounted in relation to the transmit coil and the base so as to define an MR signal excitation and detection region;

a sample support carried by the base, which support is adapted to support a sample in the defined signal excitation and detection region;

wherein the apparatus is selectively insertable by a human user in the examination region of an MR system so that that the MR signal excitation and detection region is located therein;

an evacuated region and a non-magnetic, annular dewar disposed in the evacuated region.

* * * * *